US012609282B2

(12) United States Patent
Behnke et al.

(10) Patent No.: US 12,609,282 B2
(45) Date of Patent: Apr. 21, 2026

(54) MULTI-BEAM CHARGED PARTICLE SYSTEM AND METHOD OF CONTROLLING THE WORKING DISTANCE IN A MULTI-BEAM CHARGED PARTICLE SYSTEM

(71) Applicant: Carl Zeiss MultiSEM GmbH, Oberkochen (DE)

(72) Inventors: Michael Behnke, Oberkochen (DE); Ulrich Bihr, Oberkochen (DE); Christof Riedesel, Oberkochen (DE); Arne Thoma, Oberkochen (DE); Dirk Zeidler, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 287 days.

(21) Appl. No.: 18/502,683

(22) Filed: Nov. 6, 2023

(65) Prior Publication Data

US 2024/0079207 A1 Mar. 7, 2024

Related U.S. Application Data

(63) Continuation of application No. PCT/EP2022/062392, filed on May 9, 2022.

(30) Foreign Application Priority Data

May 27, 2021 (DE) ..................... 10 2021 205 392.0

(51) Int. Cl.
*H01J 37/317* (2006.01)

(52) U.S. Cl.
CPC ............................... *H01J 37/3177* (2013.01)

(58) Field of Classification Search
USPC .......................................... 250/310, 306, 307
See application file for complete search history.

(56) References Cited

U.S. PATENT DOCUMENTS

| | | | |
|---|---|---|---|
| 4,130,761 A | 12/1978 | Matsuda | |
| 4,153,843 A | 5/1979 | Pease | |
| 4,200,794 A | 4/1980 | Newberry | |
| | (Continued) | | |

FOREIGN PATENT DOCUMENTS

| | | |
|---|---|---|
| DE | 10 2013 014 976 A1 | 3/2015 |
| DE | 10 2013 016 113 A1 | 3/2015 |
| | (Continued) | |

OTHER PUBLICATIONS

Office Action in Korean Appln. No. 10-2023-7043691, mailed on Mar. 17, 2025, 20 pages (with English translation).
(Continued)

*Primary Examiner* — Kiet T Nguyen
(74) *Attorney, Agent, or Firm* — Fish & Richardson P.C.

(57) ABSTRACT

A multi-beam charged particle system and a method of setting a working distance WD of the multi beam charged particle system are provided. With the method, the working distance is adjusted while the imaging performance of a wafer inspection task is maintained by computing parameter values of components from predetermined calibration parameter values. The method can allow a relatively fast wafer inspection task even with a wafer stage with a fixed z-position parallel to an optical axis of the multi-beam charged particle system.

20 Claims, 7 Drawing Sheets

(56) References Cited

U.S. PATENT DOCUMENTS

| | | | |
|---|---|---|---|
| 4,338,548 | A | 7/1982 | Bono |
| 4,742,234 | A | 5/1988 | Feldman |
| 5,215,623 | A | 6/1993 | Takahashi |
| 5,864,142 | A | 1/1999 | Muraki |
| 5,892,224 | A | 4/1999 | Nakasuji |
| 5,905,267 | A | 5/1999 | Muraki |
| 5,981,954 | A | 11/1999 | Muraki |
| 6,107,636 | A | 8/2000 | Muraki |
| 6,124,599 | A | 9/2000 | Muraki |
| 6,137,113 | A | 10/2000 | Muraki |
| 6,323,499 | B1 | 11/2001 | Muraki |
| 6,333,508 | B1 | 12/2001 | Katsap |
| 6,617,595 | B1 | 9/2003 | Okunuki |
| 6,633,366 | B2 | 10/2003 | De Jager |
| 6,696,371 | B2 | 2/2004 | Butschke |
| 6,787,780 | B2 | 9/2004 | Hamaguchi |
| 6,804,288 | B2 | 10/2004 | Haraguchi |
| 6,818,911 | B2 | 11/2004 | Tamamori |
| 6,835,508 | B2 | 12/2004 | Butschke |
| 6,872,950 | B2 | 3/2005 | Shimada |
| 6,903,345 | B2 | 6/2005 | Ono |
| 6,903,353 | B2 | 6/2005 | Muraki |
| 6,917,045 | B2 | 7/2005 | Hashimoto |
| 6,919,574 | B2 | 7/2005 | Hashimoto |
| 6,943,349 | B2 | 9/2005 | Adamec |
| 6,953,938 | B2 | 10/2005 | Iwasaki |
| 6,992,290 | B2 | 1/2006 | Watanabe |
| 7,005,658 | B2 | 2/2006 | Muraki |
| 7,015,467 | B2 | 3/2006 | Maldonado |
| 7,060,984 | B2 | 6/2006 | Nagae |
| 7,084,411 | B2 | 8/2006 | Lammer-Pachlinger |
| 7,091,504 | B2 | 8/2006 | Wieland |
| 7,109,494 | B2 | 9/2006 | Ono |
| 7,126,141 | B2 | 10/2006 | Ono |
| 7,129,502 | B2 | 10/2006 | Kruit |
| 7,244,949 | B2 | 7/2007 | Knippelmeyer |
| 7,285,779 | B2 | 10/2007 | Litman |
| 7,375,326 | B2 | 5/2008 | Sender |
| 7,420,164 | B2 | 9/2008 | Nakasuji |
| 7,468,507 | B2 | 12/2008 | Rogers |
| 7,504,622 | B2 | 3/2009 | Elyasaf |
| 7,535,001 | B2 | 5/2009 | Sender |
| 7,601,972 | B2 | 10/2009 | Nakasuji |
| 7,619,203 | B2 | 11/2009 | Elyasaf |
| 7,696,497 | B2 | 4/2010 | Rogers |
| 8,035,082 | B2 | 10/2011 | Yamazaki |
| 8,134,135 | B2 | 3/2012 | Kruit |
| 8,350,214 | B2 | 1/2013 | Otaki |
| 8,362,425 | B2 | 1/2013 | Han |
| 8,384,051 | B2 | 2/2013 | Ozawa |
| 8,598,525 | B2 | 12/2013 | Zeidler |
| 8,618,496 | B2 | 12/2013 | Wieland |
| 8,704,192 | B2 | 4/2014 | Sano |
| 8,748,842 | B2 | 6/2014 | Ohashi |
| 8,779,399 | B2 | 7/2014 | Yamanaka |
| 8,829,465 | B2 | 9/2014 | Tsunoda |
| 8,963,099 | B2 | 2/2015 | Yamada |
| 9,153,413 | B2 | 10/2015 | Almogy |
| 9,263,233 | B2 | 2/2016 | Zeidler |
| 9,336,981 | B2 | 5/2016 | Knippelmeyer |
| 9,336,982 | B2 | 5/2016 | Zeidler |
| 9,349,571 | B2 | 5/2016 | Kemen |
| 9,368,314 | B2 | 6/2016 | Nakasuji |
| 9,530,613 | B2 | 12/2016 | Rogers |
| 9,536,702 | B2 | 1/2017 | Lang |
| 9,607,805 | B2 | 3/2017 | Liu |
| 9,653,254 | B2 | 5/2017 | Zeidler |
| 9,702,983 | B2 | 7/2017 | Eder |
| 9,922,799 | B2 | 3/2018 | Li |
| 9,991,089 | B2 | 6/2018 | Mueller |
| 10,062,541 | B2 | 8/2018 | Ren |
| 10,141,160 | B2 | 11/2018 | Ren |
| 10,354,831 | B2 | 7/2019 | Kemen |
| 10,388,487 | B2 | 8/2019 | Zeidler |
| 10,535,494 | B2 | 1/2020 | Zeidler |
| 10,541,112 | B2 | 1/2020 | Schubert |
| 10,586,677 | B1 | 3/2020 | Okada |
| 10,600,613 | B2 | 3/2020 | Zeidler |
| 10,622,184 | B2 | 4/2020 | Knippelmeyer |
| 10,643,820 | B2 | 5/2020 | Ren |
| 10,741,355 | B1 | 8/2020 | Zeidler |
| 10,811,215 | B2 | 10/2020 | Zeidler |
| 10,854,423 | B2 | 12/2020 | Sarov |
| 10,879,031 | B2 | 12/2020 | Ren |
| 10,896,800 | B2 | 1/2021 | Riedesel |
| 2005/0201246 | A1 | 9/2005 | Buschbeck et al. |
| 2007/0272858 | A1 | 11/2007 | Tanimoto et al. |
| 2009/0014649 | A1 | 1/2009 | Nakasuji |
| 2014/0197325 | A1 | 7/2014 | Kato |
| 2015/0179399 | A1 | 6/2015 | Kruit et al. |
| 2017/0133194 | A1 | 5/2017 | Zeidler et al. |
| 2017/0133198 | A1 | 5/2017 | Kruit |
| 2017/0309449 | A1 | 10/2017 | Ren et al. |
| 2019/0195621 | A1 | 6/2019 | Ogawa et al. |
| 2019/0333732 | A1 | 10/2019 | Ren |
| 2020/0013585 | A1 | 1/2020 | Inoue et al. |
| 2020/0104980 | A1 | 4/2020 | Inoue et al. |
| 2020/0168430 | A1 | 5/2020 | Inoue et al. |
| 2020/0211810 | A1 | 7/2020 | Zeidler |
| 2020/0211811 | A1 | 7/2020 | Ren et al. |
| 2020/0243300 | A1 | 7/2020 | Zeidler |
| 2020/0271598 | A1 | 8/2020 | Tseng et al. |
| 2020/0373116 | A1 | 11/2020 | Zeidler |
| 2021/0005423 | A1 | 1/2021 | Zeidler |
| 2021/0035773 | A1 | 2/2021 | Zeidler |
| 2022/0351936 | A1* | 11/2022 | Kaufmann .......... H01J 37/1474 |
| 2023/0245852 | A1* | 8/2023 | Zeidler ................... H01J 37/21 |
| | | | 250/310 |

FOREIGN PATENT DOCUMENTS

| | | | |
|---|---|---|---|
| DE | 10 2014 008 083 A1 | 12/2015 | |
| EP | 3 683 822 A2 | 7/2020 | |
| GB | 2519511 A | 4/2015 | |
| GB | 2521819 A | 7/2015 | |
| JP | 59184524 A | 10/1984 | |
| JP | 60042825 A | 3/1985 | |
| JP | 60105229 A | 6/1985 | |
| JP | 61263217 A | 11/1986 | |
| JP | 2014229481 A | 12/2014 | |
| KR | 10-2020-0063982 A | 6/2020 | |
| TW | 202018751 A | 5/2020 | |
| WO | WO 2005/024881 | 3/2005 | |
| WO | WO 2007/028595 | 3/2007 | |
| WO | WO 2007/028596 | 3/2007 | |
| WO | WO 2007/060017 | 5/2007 | |
| WO | WO2013032949 A1 | 3/2013 | |
| WO | WO2020057678 A1 | 3/2020 | |
| WO | WO2020064035 A1 | 4/2020 | |
| WO | WO2020065094 A1 | 4/2020 | |
| WO | WO2020070074 A1 | 4/2020 | |
| WO | WO 2020/136094 A2 | 7/2020 | |
| WO | WO2020151904 A2 | 7/2020 | |
| WO | WO2020249147 A1 | 12/2020 | |

OTHER PUBLICATIONS

International Search Report and Written Opinion for corresponding PCT Appl No. PCT/EP2022/062392, dated Sep. 7, 2022.

Netherland Search Report, with translation thereof, for corresponding Appl No. NL2031975, dated Aug. 9, 2022.

German Office Action, with translation thereof, for corresponding DE Appl No. 10 2021 205 392.0, dated Apr. 28, 2022.

Office Action in Taiwanese Appln. No. 111114394, mailed on Oct. 22, 2025, 6 pages (with English translation).

Search Report in Taiwanese Appln. No. 111114394, mailed on Oct. 23, 2025, 2 pages (with English translation).

Office Action in Korean Appln. No. 10-2023-7043691, mailed on Jan. 12, 2026, 6 pages (with English translation).

* cited by examiner

MULTI-BEAM CHARGED PARTICLE SYSTEM AND METHOD OF CONTROLLING THE WORKING DISTANCE IN A MULTI-BEAM CHARGED PARTICLE SYSTEM

CROSS-REFERENCE TO RELATED APPLICATIONS

The present application is a continuation of, and claims benefit under 35 USC 120 to, international application PCT/EP2022/062392, filed May 9, 2022, which claims benefit under 35 USC 119 of German Application No 10 2021 205 392.0, filed May 27, 2021. The entire disclosure of each these applications is incorporated by reference herein.

FIELD

The disclosure relates to particle beam systems and methods for operating a multi-beam charged particle system.

BACKGROUND

Particle beam systems use particle optical units to influence beams of charged particles in a desired way, such that for example an imaging can be obtained with the beams of the charged particles. The charged particles can be electrons or ions, for example, and the particle beam systems can be used for example as microscopes or lithography apparatuses.

A multi-beam charged particle system for wafer inspection usually has a plurality of particle-optical components, each of which can influence a particle beam passing through the respective particle-optical component. By way of example, the particle-optical component can be a particle-optical lens, which has a focusing effect on the particle beam, or the particle-optical component can be a beam deflector, which deflects the particle beam by an angle. For this purpose, the particle-optical components provide electric and/or magnetic fields which act on the charged particles of the particle beam, and values or strengths of these effects can be settable by the strengths of the electric and/or magnetic fields being changed, for example by changing electrical voltages which are applied to elements which provide electric fields, or changing electric currents which are fed to coils which generate magnetic fields.

In the case of a particle optical unit, the effects of each particle-optical component is set such that the multi-beam charged particle system for wafer inspection provides a desired effect, such as, for example, a particle-optical imaging of an object plane into an image plane. Correctly setting the effects of particle-optical components of a multi-beam charged particle system for wafer inspection is often difficult in practice since a plurality of particle-optical components interact in a complicated way.

In the case of a multi-beam charged particle system for wafer inspection which provides a particle-optical imaging, it may be desired to change the working distance WD of the imaging. The working distance is the distance between a lower plane of the particle-optical lens and the object plane, in which a surface of a wafer to be investigated is positioned. Typically, a change of a working distance WD is avoided by a wafer stage which is movable in z-direction. By movement of the wafer stage, the surfaces of substrate with different thicknesses can be positioned in the image plane. However, utilizing wafer stages with movement capability in z-direction, other unwanted effects are introduced. For example, a stage can be subject to positioning inaccuracies, including a tilt and induced by drifts or vibrations. Therefore, it can be desirable to avoid stages which are movable in z-direction, and there can be an issue with changing a WD in a multi-beam charged particle system for wafer inspection in case of varying thicknesses of substrates such as wafers.

This can be achieved by changing the focusing effect of one of the particle-optical lenses.

However, this then usually also has other effects, such as a change of a rotation, a change of a magnification, a change of a telecentricity of the particle beamlets, or a change of a collection efficiency for the secondary electrons. In order to avoid this, the effects of other particle-optical components then also have to be changed.

Multi-beam charged particle systems are used for wafer inspection tasks. Here, next to the desire for relatively high resolution and image fidelity, a high throughput is to be considered. Especially when a thickness change occurs between different inspection sites of a single wafer, the change of the WD can be achieved relatively fast. Certain known methods for operating a multi-beam charged particle systems which facilitates a process of setting effects of particle-optical components in such a way that the multi-beam charged particle systems overall has the desired effect of a changing of the WD without inducing other, parasitic effects are generally too slow for wafer inspection tasks. In practice, it is usually desired to change the WD of a multi-beam charged particle system for wafer inspection such that, as a result of the change of the WD, only the WD changes, and the other performance specifications remain unchanged. For this purpose, it can be desirable to change the parameters of a plurality of particle-optical components jointly.

However, it can be difficult to determine the desired changes of the operating parameters of individual particle-optical components. In certain known system, this is carried out iteratively and is therefore to slow for a wafer inspection task with a high throughput.

SUMMARY

The present disclosure proposes a method that can provide relatively fast operation of a multi-beam charged particle system for wafer inspection including setting effects of particle-optical components in such a way that working distance WD is changed in short time without any parasitic or unwanted effects to the image resolution and image fidelity.

Furthermore, it is an object of the present disclosure to propose a particle beam system which can use a multiplicity of particle beams for generating an imaging in which the working distance is settable in a relatively fast and relatively efficient way without movement of a wafer stage in direction parallel to the working distance.

Embodiments of the disclosure provide a method for operating a multi-beam charged particle system for wafer inspection having a plurality of particle-optical components through which at least one particle beam passes and by which a change of a working distance WD can be changed in a relatively fast way with reduced (e.g., no) unwanted effects on the imaging performance as for example the resolution or image fidelity. The method can allow for a relatively high throughput in a wafer inspection task.

According an embodiment, the disclosure provides a method of setting a working distance WD of a multi-beam charged particle system for wafer inspection and a multi-beam charged particle system for wafer inspection. The multi-beam charged particle system is configured to perform a wafer inspection task with a raster of a plurality of primary charged particle beamlets. The working distance WD is defined as a distance parallel to an optical axis between a reference plane of the multi-beam charged particle system and a wafer surface of a wafer. The method comprises the step of determining a first working distance WD1 of the multi-beam charged particle system at a first inspection site of a first wafer inspection task, and the step of determining a desired change dWD of the first working distance WD1 to achieve a second working distance WD2 of a second inspection site of a second, subsequent wafer inspection task. The method further comprises the step of computing N parameter values P(1 . . . N) of a set of N parameters of components being capable to jointly change the first working distance WD1 to the second working distance WD2 while maintaining an imaging specification of a wafer inspection task. In a further step, the computed N parameter values P(1 . . . N) are provided to the components of the multi-beam charged particle system, and the second wafer inspection task is performed at the second inspection site with an inspection setting with the computed parameter values P(1 . . . N) and a corresponding image performance within the imaging specification of the second wafer inspection task. To achieve the high throughput desired of the wafer inspection task, the N parameter values P(1 . . . N) of the set of N parameters are computed, for example by interpolation from a first set of predetermined calibration parameter values P(C1, 1 . . . N) of the set of N parameters. In an example, the set of N parameters comprises a parameter to adjust or change a scan program to operate a scanning deflector of the multi-beam charged particle system, wherein the change of the scan program comprise a scan rotation to compensate a rotation of the raster of the plurality of primary beamlets and/or a change of a scanning pixel number in a scanning line to compensate a change of a pitch between the plurality of primary beamlets. In an example, the set of N parameters further comprises at least a parameter to control one of the following components of the multi-beam charged particle system: an array of micro-lenses, an array element acting as deflector array to adjust a pitch of a plurality of beamlets, first field lenses, second field lenses, an objective lens, a beam splitter, a voltage supply for an electrode to generate a retarding field, or a telecentricity compensator array. In an example, the step of determining the first working distance WD1 comprises measuring the first working distance WD1 between the wafer surface and the reference plane with a distance sensor.

In an embodiment, the method further comprises the step of loading the wafer to a wafer table with a fixed position in the z-direction parallel to the optical axis of the multi-beam charged particle system and positioning the wafer at the first inspection site beyond the reference plane of the objective lens of the multi-beam charged particle system. The method further comprises the step of moving the wafer with a wafer table with a fixed position in the z-direction parallel to the optical axis of the multi-beam charged particle system to the second inspection site. In an example, the step of determining the desired change dWD to achieve the second working distance WD2 comprises measuring the second working distance WD2 between the wafer surface and the reference plane with a distance sensor.

In an embodiment, the step of computing the N parameter values P(1 . . . N) comprises a step of selecting the inspection setting from a first inspection setting with the first set of calibration parameters values P(C1,1 . . . N) and a second inspection setting with a second set of calibration parameters values P(C2,1 . . . N). The selection of the inspection setting can be performed according a sensitivity of a change of the working distance with respect to a change of a least one of the parameters the N parameter values according the first or second set of calibration parameters values P(C1,1 . . . N) or P(C2,1 . . . N). For example, the inspection setting is selected in accordance with a desired robustness of the second wafer inspection task by selection of the second inspection setting with a minimal sensitivity of a change of the working distance with respect to a change of at least one of the parameters of the N parameter values. In an alternative example, the inspection setting is selected in accordance with a desired speed of the second wafer inspection task by selection of the inspection setting with a maximal sensitivity of a change of the working distance with respect to a change of at least one of the parameters of the N parameter values. In a further example, the selection of the inspection setting is performed according a desired threshold of an imaging performance of the second wafer inspection task.

Generally, the first set of predetermined calibration parameter values P(C1, 1 . . . N) comprise predetermined calibration parameter values P(C1, 1 . . . N) at at least three calibration working distances, and the N parameter values P(1 . . . N) according the second working distance WD2 are interpolated from the predetermined calibration parameter values P(C1, 1 . . . N) at the at least three calibration working distances.

In an embodiment, the method further comprising a calibration step of determining the first set of predetermined calibration parameter values P(C1, 1 . . . N) at at least three calibration working distances z1, z2 and z3 and storing the predetermined calibration parameter values P(C1, 1 . . . N) in a memory of the multi-beam charged particle system.

In an embodiment, the method further comprises the steps of storing the inspection setting with an inspection result of the second inspection task in a memory, and performing a post-processing of the inspection result and considering the stored inspection setting during the postprocessing. With a change of a WD according an inspection setting, also an imaging performance might be changed. The change to the imaging performance is frequently known during the selection of the inspection setting for example when the inspection setting comprises a change of a scan program of the wafer inspection task. Such changes to the imaging performance can be compensated during a post processing of the inspection result, for example during an image stitching operation or a metrology application.

According to an embodiment of the disclosure, a multi-beam charged particle system for wafer inspection is provided which is configured to perform any of the methods described above. A multi-beam charged particle system for wafer inspection comprises an object irradiation unit for focusing a plurality of primary charged particle beamlets on a surface of a wafer, and a wafer table configured for holding a wafer with a fixed position in the z-direction parallel to the optical axis of the multi-beam charged particle system, and being configured for laterally moving the wafer. The multi-beam charged particle system further comprises a detection unit, comprising a charged particle detector, and a plurality of components for jointly changing a working distance WD between the wafer surface and a reference surface of an objective lens of the irradiation unit while maintaining an imaging specification of a wafer inspection task. The multi-beam charged particle system further comprises a control unit configured for determining a first working distance WD1 at an inspection site on the wafer surface. The control operator is connected to the plurality of components for jointly changing a working distance WD.

The control unit is configured to determine parameter values P(1 . . . N) and provide the parameter values P(1 . . . N) to the plurality of components for jointly changing a working distance to the first working distance WD1 while maintaining the imaging specification of a wafer inspection task. The control unit further comprises a memory for storing at least a first set of predetermined calibration parameter values P(C1, 1 . . . N), and wherein the control unit is configured to compute the parameter values P(1 . . . N) from the first set of predetermined calibration parameter values P(C1, 1 . . . N), for example by interpolation.

A first component of the plurality of components can be a scanning deflector, and the control unit can be configured to determine and provide a scanning program to the scanning deflector to maintain the imaging specification of a wafer inspection task.

Generally, the plurality of components can comprise at least one of an array of micro-lenses, an array element acting as deflector array to adjust a pitch of a plurality of beamlets, first field lenses, second field lenses, an objective lens, a beam splitter, a voltage supply for an electrode to generate a retarding field, or a telecentricity compensator array. The multi-beam charged particle system can further comprise a distance sensor connected to the control unit, arranged and configured to measure during use the working distance between the reference surface and the wafer surface.

Further details are described at the examples of the embodiments. Further embodiments comprise combinations or variations of the examples and embodiments.

BRIEF DESCRIPTION OF THE DRAWINGS

Embodiments of the disclosure are explained in greater detail below with reference to figures, in which.

DETAILED DESCRIPTION

Figure 1:
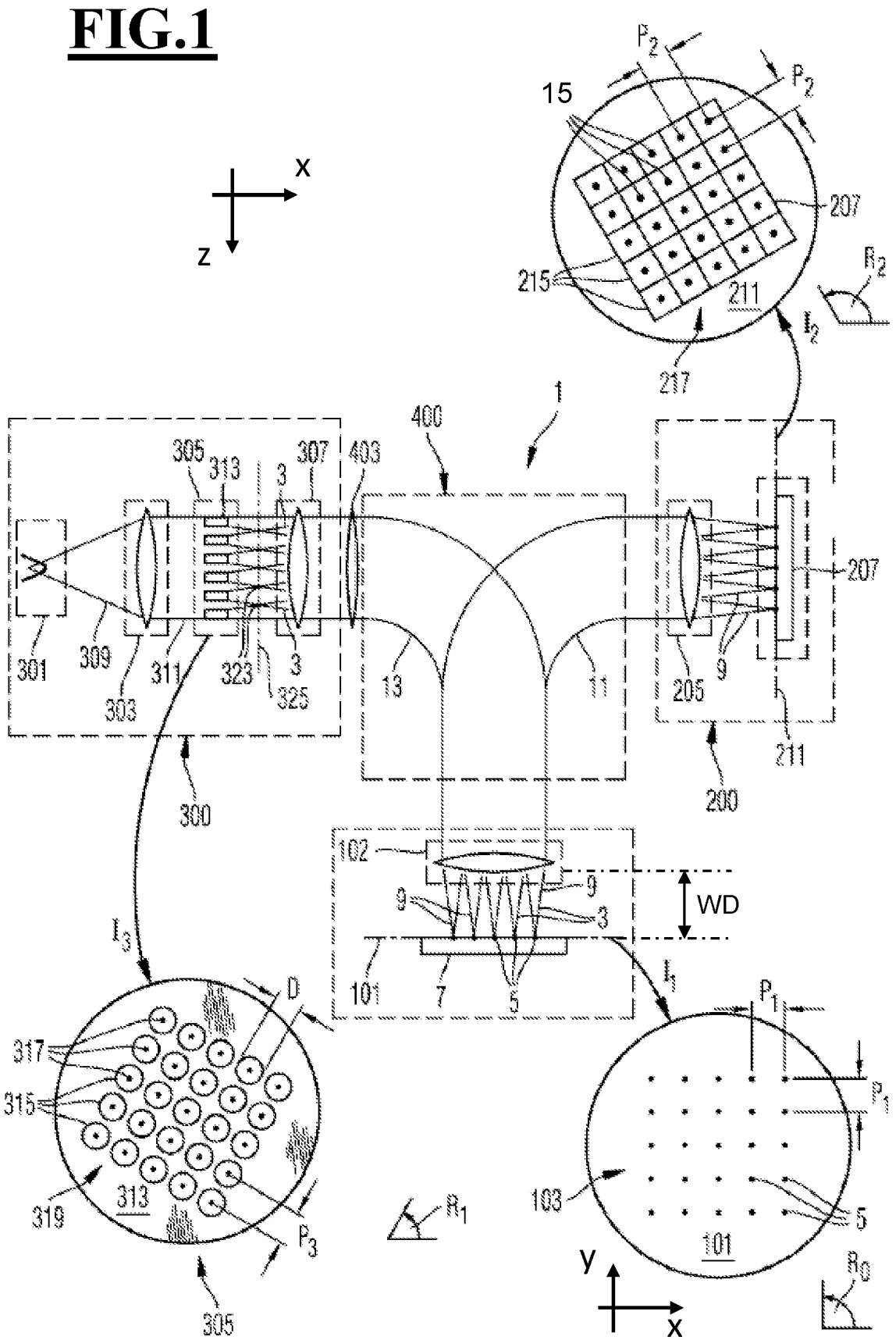
FIG. 1 shows a particle beam system illustrating some aspects of the disclosure.

FIG. 1 is a schematic illustration of a multi-beam inspection system which uses a plurality of particle beams. The inspection system generates a plurality of primary particle beams which impinge on an object to be examined in order to generate secondary electrons which proceed from the object and are subsequently detected. The inspection system 1 is of the scanning electron microscope (SEM) type which uses a plurality of primary electron beams 3 which are focused at locations on a surface of an object 7 and generate a plurality of electron beam spots 5 there. The object 7 to be inspected can be a wafer or other components such as a semiconductor mask for semiconductor fabrication or an arrangement of miniaturized elements. The surface of the object 7 is arranged in an object plane 101 of an objective lens 102. The distance between the object plane and a reference surface of the objective lens 102 is called the working distance WD.

The enlarged excerpt I1 in FIG. 1 shows a plan view of the object plane 101 with a regular rectangular raster 103 of impingement locations 5 which are formed in the plane 101. In FIG. 1, the number J of primary beamlets and of impingement locations is 25, which are arranged as a 5×5 raster pattern 103. The number J=25 of impingement locations is a small number chosen for reasons of simplified illustration. In practice, the number J of beamlets 3 or impingement locations 5 can be chosen to be significantly greater, such as, for example, 20×30, 100×100 and the like.

In the embodiment illustrated, the raster 103 of impingement locations 5 is a substantially regular rectangular raster with a constant distance or pitch P1 between adjacent impingement locations. Exemplary values of the pitch P1 are 1 μm, 10 μm or 40 μm. However, it is also possible for the raster 103 to have other symmetries, such as, for example, a hexagonal symmetry.

A diameter of the beam spots 5 formed in the object plane 101 can be small. Exemplary values of this diameter are 5 nm, 3 nm, or even below 2 nm, such as 1 nm. Focusing of the particle beams 3 for forming the beam spots 5 is carried out by the objective lens system 102.

The particle beamlets 3 impinging on the object 7 generate secondary electrons which emanate from the surface of the object 7. The electrons emanating from the surface of the object 7 are shaped by the objective lens 102 to form secondary electron beamlets 9. The inspection system 1 provides a detection unit 200 with a secondary electron beam path 11 for the secondary electron beamlets 9. The detection unit 200 comprises a projection system 205 to image and focus the secondary electron beamlets 9 on an image plane 211 of an electron multi-detector 207.

The excerpt I2 in FIG. 1 shows a plan view of the image plane 211 in which individual detection regions 215 are arranged, on which the plurality of secondary electron beamlets 9 impinge at focus points 15. The focus points 15 form a second raster 217 with a regular pitch P2 between the impingement locations. Exemplary values of the pitch P2 are 10 μm, 100 μm or 200 μm.

The primary electron beamlets 3 are generated in a beam generating device 300 comprising at least one electron source 301, at least one collimation lens 303, a multi-aperture arrangement 305 and at least a first field lens 307. The electron source 301 generates a diverging electron beam 309. A collimation lens 303 forms from electron beam 309 a collimated beam 311 which illuminates the multi-aperture arrangement 305.

The excerpt I3 in FIG. 1 shows a plan view of a first surface 313 of the multi-aperture arrangement 305. The multi-aperture arrangement 305 comprises a first multi-aperture plates having a plurality of openings or apertures 315 formed therein. Midpoints 317 of the openings 315 are arranged in a raster 319 corresponding to the raster 103 formed by the beam spots 5 in the object plane 101. A pitch P3 between the midpoints 317 of the apertures 315 can have exemplary values of 5 μm, 100 μm and 200 μm.

The multi-aperture arrangement 305 focuses the electron beamlets 3 in such a way that beam foci 323 are formed in a plane 325. A diameter of the foci 323 can be 10 nm, 50 nm or 100 nm, for example.

The field lens 307 and the objective lens 102 provide—together with other lenses illustrated in FIG. 2 below—an illumination multi-beam charged particle system for imaging the plane 325 in which the foci are formed onto the object plane 101, such that the raster 103 of impingement locations 5 or beam spots is formed there on the surface of the object 7.

The objective lens 102 and the projection lens system 205 provide a second imaging multi-beam charged particle system for wafer inspection for imaging the object plane 101 onto the detection plane 211. The objective lens 102 is thus a lens which is both part of the first and part of the second particle optical unit, while the field lens system 307 belongs only to the first multi-beam charged particle system for wafer inspection and the projection lens system 205 belongs only to the second particle optical unit.

A beam switch or beam splitter unit 400 is provided in the beam path of the first multi-beam charged particle system for wafer inspection between the multi-aperture arrangement 305 and the objective lens system 100. The beam switch 400 is also part of the second multi-beam charged particle system for wafer inspection in the beam path between the objective lens system 100 and the detection unit 200. The beam switch 400 comprises further an adjustment lens 403 for adjusting the primary beamlets to the beam switch 400.

A further parameter for characterizing the performance are the different rotations of the raster configurations 103, 319 and 217, introduced by magnetic lenses, such as objective lens 102 or further magnetic lenses. FIG. 1 shows a desired orientation for example of the raster 103 of the impingement locations 5 in such a way that the latter are arranged along x- and y-coordinates in the object plane 101. A value of this orientation is designated by the angle R0 in FIG. 1. To account for the rotation of the particle-optical imaging provided by the first particle optical unit 100, the raster of the particle beams 317 has an orientation in such a way that the particle beams, after passing through the first particle optical unit 100, impinge on the object plane 101 as a field with the orientation R0. The requisite orientation of the raster 319 of the generated particle beams is represented by the angle R1 in FIG. 1.

Further information concerning such multi-beam inspection systems and components used therein, such as, for instance, particle sources, multi-aperture plates and lenses, can be obtained from the international patent applications WO 2005/024881, WO 2007/028595, WO 2007/028596 and WO 2007/060017, U.S. Pat. No. 9,991,089 BB, and the German patent applications having the application numbers DE 10 2013 016 113.4 and DE 10 2013 014 976.2, the disclosure of which in the full scope thereof is incorporated by reference in the present application.

Figure 2:
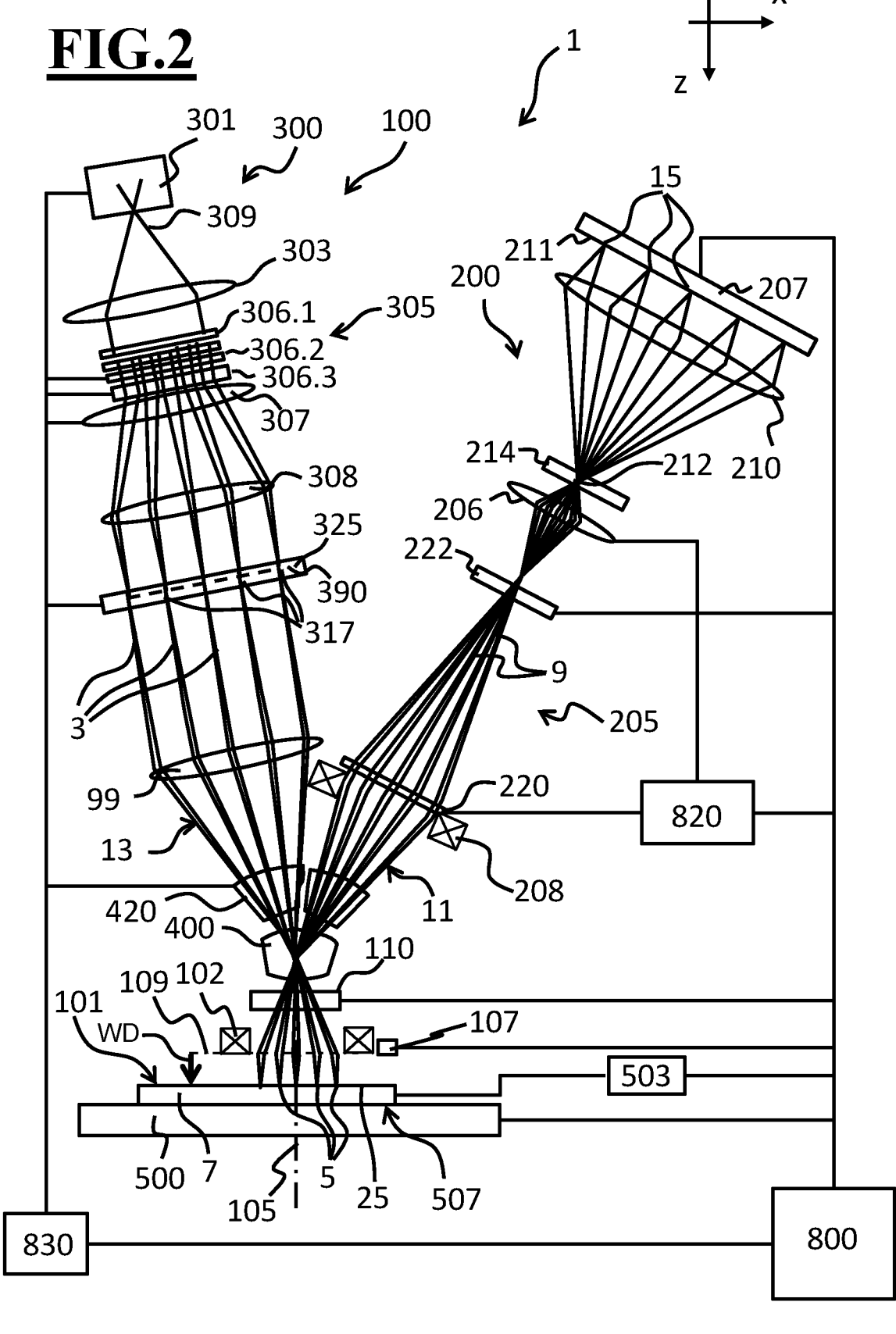
FIG. 2 shows a particle beam system illustrating further aspects of the disclosure.

FIG. 2 provides more details of a multi-beam charged particle system according the disclosure. The multi-beam charged particle system for wafer inspection provides a particle-optical imaging of the first plane 325 into the object plane 101, in which the surface 25 of a wafer 7 is located. One parameter for characterizing the particle-optical imaging is the working distance WD between the object plane 101 and a reference plane 109, for example a lower plane of the objective lens 102 along the beam axis 105. The working distance WD is monitored for example by z-sensor 107. Suitable z-sensor are well known in the art and can comprise a Laser interferometer, a grating interferometer, a confocal sensor for example including a lens array, or a capacitive sensor. In systems of the prior art, the working distance is kept constant, for example to values of WD between 1 mm and 2 mm, for example WD=1.400 mm or WD=1.500 mm, and the surface 25 of the wafer 7 is positioned in the object plane 101 via a wafer stage 500 which is movable in z-direction, parallel to the optical axis 105. The WD is then monitored and controlled with sensor 107 and kept in the object plane 101 with the z-stage with an accuracy of about 50 nm or less. However, stages which are movable in z-direction can be less desirable than a mechanically fixed stage 500, which is only movable in x-y-plane, but fixed in z-position. With a stage fixed in z-position, any parasitic movement in z-direction or unwanted tilt of the stage is avoided. Therefore, stages 500 with a mechanical fixed position in z-direction can offer relatively fast and high precision wafer inspection.

A constant position in z-direction can for example be achieved with a mechanical determination of the z-position of the stage 500. The mechanical determined and fixed z-position of the stage however causes a problem with wafers 7 having a variable thickness.

In this case, wafer stage 500 has a wafer holding plane 507 at a constant z-position and thus at a constant distance to the reference plane 109, which is fixed to the desired WD and a standard wafer thickness. The thickness of a wafer 7 is about 700 $\mu$m to 1 mm. For example, with a typical standard wafer thickness of 700 $\mu$m and a WD of 1.400 mm, the nominal z-distance between reference plane 109 and wafer holding plane 507 is 2,100 mm with a maximum deviation of below 50 nm. However, the thickness of a wafer can change by up to several micrometers during the fabrication of integrated circuits on the wafer 7. Typically, the thickness of different wafers can vary by 100 $\mu$m, but larger variations of about 300 $\mu$m are possible as well. According the disclosure, the focus points 5 are kept at the surface 25 of a wafer 7 within the desired accuracy of about better than 50 nm by a method of fast changing the working distance WD of up to several 10 $\mu$m, such up to 100 $\mu$m, or for example up to 300 $\mu$m.

Figure 3:
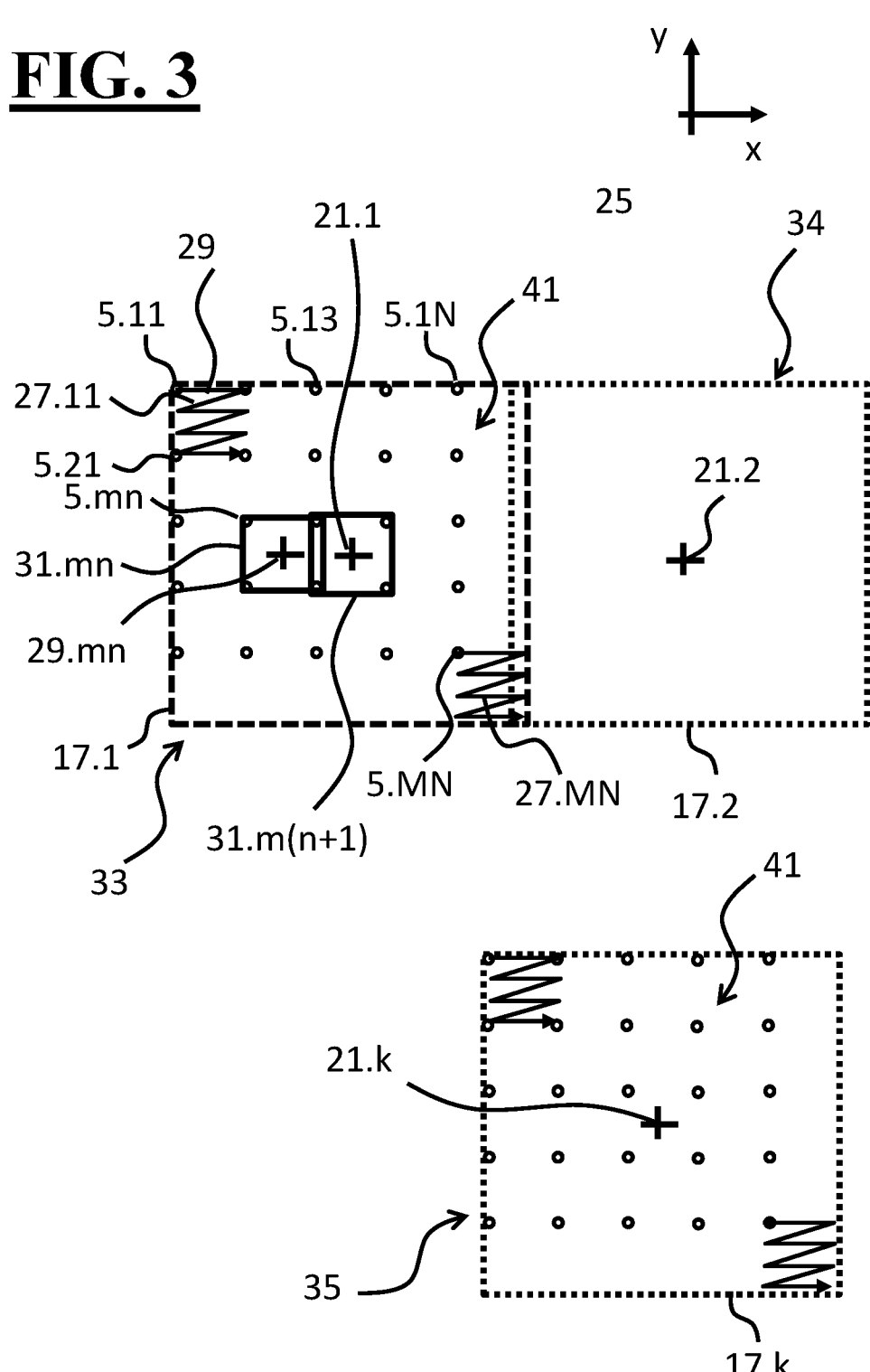
FIG. 3 illustrates a wafer inspection task.

The method of wafer inspection by acquisition of image patches is explained in more detail in FIG. 3. FIG. 3 illustrated the surface 25 of a wafer z with a sequence of wafer inspection sites 33, 34, and 35. The wafer 7 is placed with its upper wafer surface 25 in the focus plane of the plurality of primary charged particle beamlets 3, with the center 21.1 of a first image patch 17.1. The predefined position of the image patches 17.1 . . . k corresponds to inspection sites 33 to 35 of the wafer 7 for inspection of semiconductor features. The predefined positions of the first inspection site 33, the second inspection site 34 and the third inspection site 35 are loaded from an inspection file in a standard file format. The predefined first inspection site 33 comprises the first image patch 17.1 and the first center position 21.1 of the first image patch 17.1 is aligned under the optical axis 105 of the multi-beam charged-particle system 1 for the first image acquisition step of the inspection task. The first center of a first image patch 21.1 is selected as the origin of a first local wafer coordinate system for acquisition of the first image patch 17.1. Methods to align the wafer 7, such that the wafer surface 25 is registered and a local coordinate system of wafer coordinates is generated, are well known in the art.

The plurality of primary beamlets 3 is distributed in a regular raster configuration in each image patch 17.1 . . . k and is scanned by a raster scanning mechanism to generate a digital image of the image patch. In this example, the plurality of primary charged particle beamlets 3 is arranged in a rectangular raster configuration 41 with N primary beam spots 5.11, 5.12 to 5.1N in the first line with N beam spots, and M lines with beam spots 5.11 to beam spot 5.MN. Only M=five times N=five beam spots are illustrated for simplicity, but the number of beam spots J=M times N can be larger, for example J=61 beamlets, or about 100 beamlets or more, and the plurality of beam spots 5.11 to 5.MN can have different raster configurations 41 such as a hexagonal or a circular raster.

Each of the primary charged particle beamlet is scanned over the wafer surface 25, as illustrated at the example of primary charged particle beamlet with beam spot 5.11 and 5.MN with scan path 27.11 and scan path 27.MN. Scanning of each of the plurality of primary charged particles is performed for example in a back-and forth movement with scan paths 27.11 . . . 27.MN, and each focus point 5.11 . . . 5.MN of each primary charged particle beamlet is moved by the multi-beam scanning deflector system 110 collectively in x-direction from a start position of an image subfield line, which is in the example the most left image point of for example image subfield 31._mn_. Each focus point 5.11 . . . 5.MN is then collectively scanned by scanning the primary charged particle beamlets 3 collectively to the right position, and then the collective multi-beam raster scanner 110 moves each of the plurality of charged particle beamlets in parallel to line start positions of the next lines in each respective subfield 31.11 . . . 31.MN. The movement back to line start position of a subsequent scanning line is called fly-back. The plurality of primary charged particle beamlets 3 follow in parallel scan paths 27.11 to 27.MN, and thereby a plurality scanned images of the respective subfields 31.11 to 31.MN is obtained in parallel. For the image acquisition, as described above, a plurality of secondary electrons is emitted at the focus points 5.11 to 5.MN, and a plurality of secondary electron beamlets 9 is generated. The plurality of secondary electron beamlets 9 are collected by the objective lens 102, pass the first collective multi-beam raster scanner 110 and are guided to the detection unit 200 and detected by image sensor 207. A sequential stream of data of each of the plurality of secondary electron beamlets 9 is transformed synchronously with the scanning paths 27.11 . . . 27.MN in a plurality of 2D datasets, forming the digital image data of each image subfield. The plurality of digital images of the plurality of image subfields is finally stitched together by an image stitching unit to form the digital image of the first image patch 17.1. Each image subfield is configured with small overlap area with adjacent image subfields, as illustrated by overlap area of subfield 31._mn_ and subfield 31._m_ (n+1). After performing the first inspection task at the first inspection site 33, the wafer table 500 moves the wafer to the second inspection site 34, or generally to the next inspection site and the image acquisition is repeated at the next inspection site.

Next, the desired properties or specifications of a wafer inspection task are illustrated. For a high throughput wafer inspection, the time for image acquisition of each image patch 17.1 . . . k including the time for image postprocessing is fast. On the other hand, tight specifications of image qualities such as the image resolution, image accuracy and repeatability is maintained. For example, the desired image resolution is typically 2 nm or below, and with high repeatability. Image accuracy is also called image fidelity. For example, the edge position of features, in general the absolute position accuracy of features is to be determined with high absolute precision. Typically, the desired position accuracy is about 50% of the desired resolution or even less. For example, measurement tasks can involve an absolute precision of the dimension of semiconductor features with an accuracy below 1 nm, below 0.3 nm or even 0.1 nm. Therefore, a lateral position accuracy of each of the focus spots 5 of the plurality of primary charged particle beamlets 3 is below 1 nm, for example below 0.3 nm or even below 0.1 nm. Under high image repeatability it is understood that under repeated image acquisition of the same area, a first and a second, repeated digital image are generated, and that the difference between the first and second, repeated digital image is below a predetermined threshold. For example, the difference in image distortion between first and second, repeated digital image is below 1 nm, for example 0.3 nm or even such as below 0.1 nm, and the image contrast difference is below 10%. In this way, a similar image result is obtained even by repetition of imaging operations. This is important for example for an image acquisition and comparison of similar semiconductor structures in different wafer dies or for comparison of obtained images to representative images obtained from an image simulation from CAD data or from a database or reference images.

One of the desired properties or specifications of a wafer inspection task is throughput. The measured area per acquisition time is determined by the dwell time, resolution and the number of beamlets. Typical examples of dwell times are between 20 ns and 80 ns. The pixel rate at the fast image sensor 207 is therefore in a range between 12 Mhz and 50 MHz and each minute, about 15 to 20 image patches or frames can be obtained. For 100 beamlets, typical examples of throughput in a high-resolution mode with a pixel size of 0.5 nm is about 0.045 sqmm/min (square-millimeter per minute), and with larger number of beamlets, for example 10000 beamlets and 25 ns dwell time, a throughput of more than 7 sqmm/min is possible. The embodiments of the disclosure enable the high throughput of a wafer inspection task while maintaining the image performance specification well within the properties described above.

Figure 4:
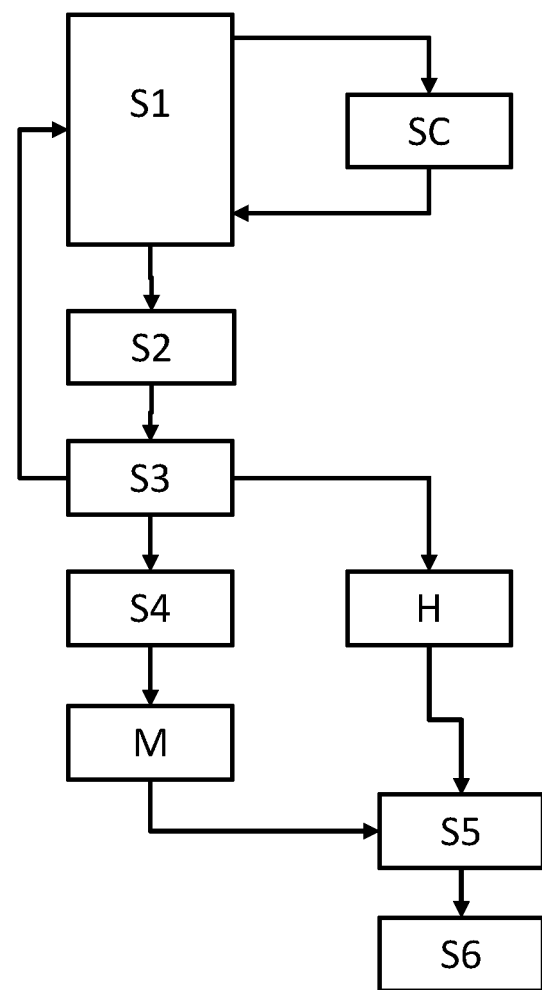
FIG. 4 shows a method of operating the charged particle system according an embodiment.

In a multi-beam system, readjusting the WD using only the objective lens 102 as a focusing element affects also for example the position of the focus points 5 on the sample surface, leading for example to a loss in resolution or an increased effort when stitching the plurality of images obtained by the plurality of beamlets. Stitching might even become impossible if no overlap between the image segments of the individual subfield for each individual primary beamlet exists. In a multibeam system with a projection system 205 for the secondary electrons scattered or emitted from the sample surface 25, any change of the WD and consequently the distance between the sample surface 25 and the detector plane 211 is generally considered. Any variation can lead to an increase in crosstalk between the plurality of secondary beamlets 9. The fast changing of the WD can therefore involve a change of a plurality of parameters of the multibeam system. The fast changing is achieved by following steps, which are illustrated in FIG. 4.

In Step S1, an actual working distance WD and a desired change of a working distance for a next inspection site of a wafer inspection task is determined.

The actual working distance WD is either measured by sensor 107 or determined from the parameters settings of the multi-beam charged particle microscope. In an example, the actual WD of the multi-beam charged particle microscope might deviate from the expected WD according the parameters settings, and information provided by the image sensor 207 at a previous measurement position can be utilized to compute the actual WD with higher accuracy.

The desired change of the actual working distance dWD for a next inspection site is determined for example from the working distance of pervious inspection sites. For example, if a tilt in a wafer surface is present, an WD of a next inspection site can be extrapolated from previous determinations of WDs at previous inspection sites. In another example, the WD of the next inspection site is extracted from a look-up table of previously achieved registration.

Such a registration can include a measurement of the z-position of the upper surface 25 of a wafer 7 at several locations. From the measurement of the z-positions of the upper surface 25 of a wafer 7 at several lateral locations, an actual z-position of the upper surface 25 of a wafer 7 at an inspection site can be computed for example by linear interpolation. Generally, it is to be considered that the typical very flat wafers have about 300 mm diameter, and inspections sites corresponding to an image field of the multi-beam charged particle system have typically diameters of about 100 μm. A wedge-shaped form of a wafer thus typically can be accepted, as long as the image plane 101 can be adjusted to the surface 25 of the wafer corresponding to a local thickness variation of a wafer 7 at the inspection site.

It is also possible to determine or verify the WD at a new inspection site by use or the distance sensor 107 after lateral movement of the wafer position to the next inspection site. In some examples a calibration step SC might be involved to set the WD to the target WD.

Other sources for a desired change of the actual working distance dWD can comprise a priori information, for example when wafers of an identical batch are to be inspected, of when an inspection site is repeatedly inspected.

In Step S2, the desired change of the setting of the multi-beam charged particle microscope is computed. As will be explained below in more detail, a change of a dWD involves a change a large number of driving parameters P of many components of the multi-beam charged particle system 1. The components typically have nonlinear interactions and the derivation of the driving parameters P of the many components is generally time consuming. For example, the driving parameters P for a desired change of WD alone build a non-orthogonal and nonlinear-system. In addition, a change in WD induces typically other unwanted effects to the imaging performance and a plurality of parameters of a plurality of compensators have to be changed accordingly. A mathematical solution of the inverse problem is thus not possible and involves a complex optimization. However, according one aspect of the disclosure, the driving parameters of a plurality of N components including components to change the WD and compensators to compensate unwanted effects to the image performance can be linearized at least over small ranges of the WD change. According the disclosure, selected N driving parameters P(n) of the multi-beam charged particle microscope 1 are computed by locally interpolating the driving parameters P(n) from previously determined parameters P(C,n) at a set of calibrating working distances WD. This computation is very fast and does not involve complex matrix inversions.

In Step S3, the determined N driving parameters P(n) are provided to the multi-beam charged particle microscope 1 and the working distance WD is changed without movement of any component in the z-direction and with very small effect to other performance properties of the multi-beam charged particle microscope. In some examples, it might be desirable to repeat steps S1 to S3.

The driving parameters P(n) and their effect to other performance properties is called the inspection setting. The final inspection setting for each inspection site is recorded in a history file in step H.

In step S4, the inspection task is performed, and a digital image data of the inspection site is obtained. The digital image data is stored in step M in a memory.

In step S5, the digital image data of the inspection site is processed. In an example, the inspection setting can be considered during the image data processing. In an example, the processing comprises a computation of a distance or an extension or an area of a feature.

Here, a residual magnification change or pixel resolution can be considered as part of the inspection setting. In an example, the processing comprises an image stitching. Here, a residual pitch error or raster rotation of the raster as part of the inspection setting of primary beamlets can be considered. In an example, the processing comprises an adjustment of an image brightness. Here, a residual telecentricity error as part of the inspection setting can be considered. Other residual deviations from the performance properties of the multi-beam charged particle microscope are possible and can be considered in the image data processing as well. The step of data processing can be in parallel to the inspection tasks or can be performed by an independent computing system, for example a parallel computing system. Finally, inspection results are obtained and provided in step S6 for example to a supervisor or to a fabrication control system.

Next the elements for changing the working distance WD according step S2 and step S3 and the performance properties according to the inspection setting of the multi-beam charged particle system are explained. Reference is again made to FIGS. 1 and 2. There is a variety of ways to change the WD, but none of them alone operates without severe impact of the performance properties of the multi-beam charged particle microscope.

A first way to adjust the working distance WD is the primary multi-beamlet-forming unit 305. The primary multi-beamlet-forming unit 305 comprises active multi-aperture plates 306.1 to 306.3, which either independently or jointly form at least one array of micro-lenses. By a change of the focal length of the array of micro-lenses, the position of the intermediate image plane 325 is changed and consequently also the working distance.

However, the array of micro-lenses 306 of the primary multi-beamlet-forming unit 305 have a limited range to change the WD. The range of the micro-lenses 306 might be desired to compensate a field curvature as well, and the full range cannot be used to change the WD.

A second way to adjust the working distance WD is given by the field lens system 307 and 308. By changing the WD with the field lens system 307, also the numerical aperture and the pitch of the beamlets is changed. A change of pitch is typically unwanted, because it would also involve a change of the number of scanning pixels for each beamlet and thus involve a change of the scanning operation. In some multi-beam charged particle systems 1 such es illustrated in FIG. 2, a further multi-array optical element 390 is arranged in the intermediate image plane 325. The multi-array optical element 390 is a deflector array, configured to individually deflect each primary beamlet to adjust a telecentricity property of the plurality of primary beamlets at the wafer surface 25. With the multi-array optical element 390 arranged close to the intermediate image plane 325, the angle of incidence of each primary beamlet can be adjusted. Despite the fact that the multi-array optical element 390 can be provided with larger apertures for transmitting the primary beamlets 3 and thus it is allowing a small change of pitch of the beamlets, the multi-array optical element 390 nevertheless limits the capability for the use of the field lens 307 or 308 to change the WD.

A third way to adjust the WD are the field lenses 99. With field lenses 99, also the pitch and the numerical aperture is changed, but in a different relation compared to the field lens 307. This is similar to an optional additional adjustment lens 403 (see FIG. 1), which forms a part of the beam splitter 400. The additional adjustment lens 403 forms a fourth way to change the WD.

A fifth way to adjust the WD is given by the objective lens 102. However, by adjusting the WD with the objective lens 102, also a rotation angle of the raster configuration 103 is changed. In normal operation, magnetic objective lens 102 is adjusted to a rotation of the raster configuration from the rotated raster configuration 319 of the multi-aperture plate 305 to the orthogonal raster 103, with focus points 5 oriented in parallel to x- and y-directions. By changing the parameters of the objective lenses 102, also the rotation angle is changed.

A sixth way to adjust WD are the retarding potential provided to the wafer 7 via a voltage supply 503. The retarding field generated between the objective lens 102 und the wafer surface 25 has an impact on the WD, but also changes the numerical aperture and the kinetic energy of the primary electrons and predominantly the kinetic energy of the secondary electrons emitted from the wafer surface 25. Both changes have an impact on resolution and imaging properties of the secondary electron imaging by the detection unit 200.

Generally, the components and the plurality of N parameters P(n) to be changed for an adjustment of the WD comprise a set of components of the charged-particle multi-beamlet generator 300, such as the array of micro-lenses 306.1 of the lenses within the primary multi-beamlet-forming unit 305, an array element acting as deflector array, such as element 306.3 of the primary multi-beamlet-forming unit 305, and the field lenses 307 and 308. With the joint activation of the components of the charged-particle multi-beamlet generator 300, the focus plane 325 is shifted in propagation direction of the plurality of primary beamlets without a change of the pitch P3 and without a change of the rotation angle R1 and an adjustment of the working distance WD is achieved.

However, the change of the WD with the components of the charged-particle multi-beamlet generator 300 is of limited range and comes along with the implication of a change in the numerical aperture and thus the resolution of the imaging task to be performed.

For a larger range of the adjustment of the WD, the components and the plurality of N parameters P(n) to be changed for an adjustment of the WD comprise a set of components of the primary beam-path 13, including the field lenses 99, the objective lens 102 and the retarding field generated by voltage supply 503. With these elements, larger range of WD adjustments can be addressed and a drop in resolution can be mitigated.

In addition to the components used for the adjustment of the WD, the components and the plurality of N parameters P(n) to be changed for an adjustment of the WD comprise a first set of compensators for compensation of unwanted effects in the primary beam-path 13. Such compensators comprise the beam splitter 400 or components of the beam splitter such as alignment lens 403, and the scanning deflector 110, respectively the parameters for the scan program. Further compensators are the stigmator array such as element 306.3, which comprises a multi-pol array for deflecting and adjusting the plurality of primary beamlets 3, and telecentricity compensator array 390. Further optional compensators are given by quasi static adjustment deflectors in the primary beam path, which control the position of the plurality of primary beamlets at the optical axis 105.

A second set of compensators is used in the detection unit 200, as described below.

Generally, during an adjustment of the WD, unwanted changes to the raster configuration 103 are introduced, for example a variation of the beam pitch P1 or an imaging aberration such as an astigmatism. Other unwanted effects are a rotation of the raster configuration 103 by angles different to the target angle R0. Further unwanted effects are a deviation from a telecentricity property of the plurality of beamlets. Generally, it is desired that all primary beamlets 3 impinge on the wafer surface 25 at an identical angle and perpendicular to the surface 25 of the wafer 7. However, after a change of the WD, the angles of individual beamlets might deviate from a common angle and may not be perpendicular to the wafer surface 25. Unwanted changes are compensated by a set of compensators or manipulators.

Therefore, the method of adjusting the WD comprises the change of a plurality of N parameters P(N), including of operating parameters for a plurality of the above mentioned ways to adjust the working distance WD and including parameters of a plurality of compensators for compensating the unwanted effects and thereby keep the multi-beam charged particle system in an operation condition within the performance specification of a wafer inspection task. The operation condition might nevertheless be subject to minor changes to the image performance or image data generated, and the operation condition and corresponding image performance is thus recorded as the inspection setting mentioned above.

The compensators comprise a multi-stigmator array 306.3 for an individual manipulation of each primary beamlet. The multi-stigmator array 306.3 comprises a plurality of apertures similar to element 305, but each aperture is provided with a plurality of individually addressable electrodes for manipulating each beamlet, for example with eight individually addressable electrodes for each beamlet. Thereby, an individual aberration of each beamlet or a small amount of a pitch change or a small rotation can be compensated.

In some examples, the compensators comprise a multi aperture deflector array 390 for adjusting a telecentricity property of the beamlets. The deflector array 390 comprises a plurality of apertures similar to element 305, but each aperture is provided with a plurality of individually addressable electrodes for manipulating each beamlet, for example with four individually addressable electrodes for each beamlet. Thereby, each beamlet can be deflected and the angle of each beamlet can be changed individually.

Figures 6A, 6B:
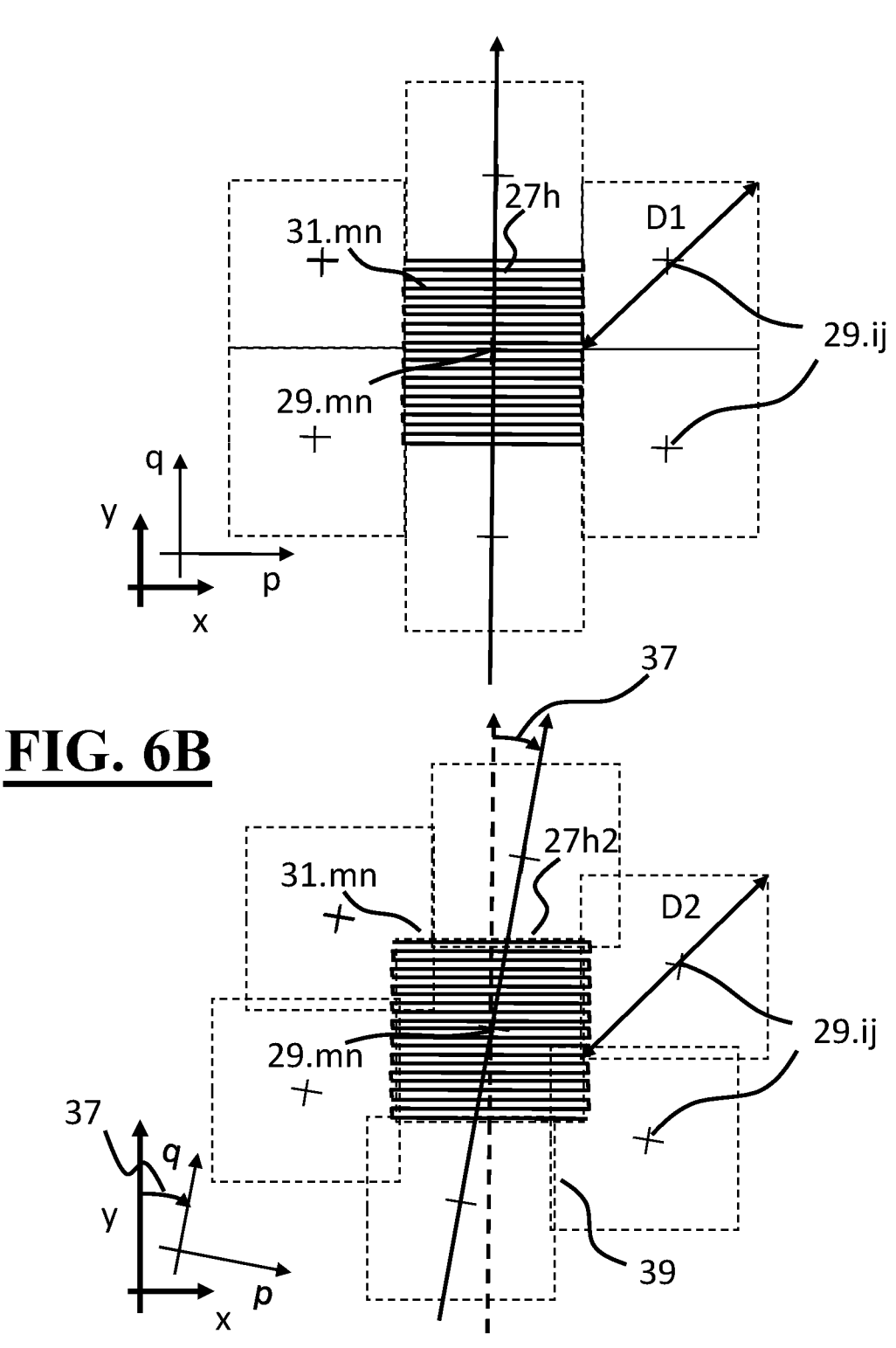
FIGS. 6A-6B shows the effect of a rotation of the raster pattern and a way of compensation according an embodiment of the disclosure.

The scanning program for driving the raster scanners 110 and 222 forms a further compensator for compensation of a rotation of the raster configuration and a change of a pitch of the raster configuration 103. With a set of parameters for adjusting the scanning program, an image rotation is least partially compensated by a rotation of the scanning operation by the raster scanner 110 for collective scanning deflection of the plurality of primary beamlets. An example is illustrated in FIGS. 6A-6B for a hexagonal raster of primary beamlets. Only seven center coordinates 29.ij of the plurality of image subfields 31 are illustrated by crosses. Each center coordinate 29.ij represents a focus point 5 of one of the plurality of primary charged particle beamlets 3 when the collective multi-beam deflector 110 is in an off state. In FIG. 6A the raster 103 is not rotated and center coordinates arranged in columns and lines are arranged parallel to the x-y coordinates.

The diameter of one subfield 31.ij, which is raster scanned by scan pattern 27h according the predefined scan program, has a diameter of D1. After an adjustment of the working distance for example by objective lens 102 after the raster scanner, a rotation 37 of the raster configuration 103 or primary charged particle beamlets 3 may arise. With a modified and rotated scan program the multi-beam charged particle system 1 is configured to maintain a scanning direction for example parallel to an x-direction even when the raster configuration 103 is rotated by an angle 37. According a rotation 37 of the raster configuration, the first scan program with scan pattern 27h is changed to second scan program 27h2, which can cover a slightly larger area corresponding to slightly larger image subfields 31 with diameter D2 and with longer scanning lines in parallel to the x-direction. This is illustrated in FIG. 6B. After a rotation 37 of the raster configuration 103, a pitch between two beamlets in the x-direction is increased, and a length of a scanning line in x-direction is be increased accordingly. After a rotation 37 of the raster configuration 103, a pitch between two beamlets in the y-direction is increased, and a number of scanning line in y-direction is be increased accordingly. With a change of at least a length of a scanning line or the number of scanning lines between the first scan program 27h and the second scan program 27h2, the size of the plurality of J image subfields 31 is changed and the image patch is covered with the plurality of image subfields at the expense of a slight increase of the pixel number per scanning lines. The change of the scan program or scan pattern is not limited to hexagonal raster configurations, but can also be applied to one-dimensional raster configurations, circular raster configurations or rectangular raster configurations as illustrated in FIG. 3.

A change of a beam pitch is typically compensated by a combination of several components, including the components to adjust the working distance WD. If a beam pitch adjustment to a predetermined beam pitch cannot be achieved, the parameters for the scanning program are changed and for example the number of image pixels along a scanning line and the number of scanning lines is increased or reduced, thereby a constant pixel resolution for different working distances is achieved.

Together with an adjustment of the WD in the primary beam path, the imaging performance of the secondary electron beamlets 9 between the object surface 25 and the detector 207 is maintained. The multi-beam charged particle system for wafer inspection provides a detection unit 200 in which the distance between the planes 101 and the plane 211 of the detector 207 is changed in accordance with a change of the working distance WD. Furthermore, the imaging performance of the detection unit 200 might be changed by changing of any of the operation parameters of components in the joint beam path, including components such as the objective lens 102, the retarding potential between objective lens 102 and object surface 25 by voltage supply 503, and the collective scanner 110. Therefore, within the projection system 205 of the detection unit 200, a plurality of second compensators is arranged, including a plurality of lenses 206, 208 and 210, which maintain a focus position of the focus points 15 of the plurality of secondary beamlets 9 on the detector plane 211 and in parallel maintain a beam cross over 212 of the secondary beamlets 9 at a filter plane, where a contrast filter 214 is arranged. In an example, the compensators in the projection system 205 further comprise array elements such as array element 220, by which individual secondary beamlets 11 can be influenced. Furthermore, the rotation is also a parameter for characterizing the projection system 205. The field 103 of second particle beams which proceeds from the plane 101 with the orientation R0, after passing through the projection system 205, impinges on the plane 211 with an orientation, which is designated by the angle R2 in FIG. 1. A change in the rotation of the raster configuration is compensated for example by a magnetic lens 208 in the projection system 205, which is variably controlled by operating parameters. The N operation parameters P(n) to adjust a WD therefore include operation parameters to control components of the projection system 205 for projecting the secondary electron beamlets 9 on the detector. Further, and synchronized with the raster scanner 110 for the plurality of primary beamlets, also an operation of the raster scanner 222 in the secondary beam-path is adjusted and synchronized.

The detector 207 itself can provide a further way to compensate a change in image pitch P2 or a change in rotation angle R2. For example, a detector 207 con comprise a mechanical way to adjust the rotation angle. A mechanical rotation, however, is typically to slow for a fast wafer inspection task. In another example, the detector comprises a plurality of pixels, and an assignment of secondary electron focus points 15 to image pixels of the detector 207 is changed. A reassignment of detector pixels can be achieved with high speed.

Including a plurality of the components mentioned above, the number N of parameters P(n) to be changed for an adjustment of the WD is typically about N>=15. For example, the field lens 99 can be formed by two or three lenses and involve two or three parameters for an adjustment. For example, the multi-pole array element 306.3 can be configured for a change of a beam pitch via a plurality of deflections and for a correction of a constant astigmatism as well as a quadratic field component of an astigmatism of the plurality of primary beamlets 3 over the raster configuration 103, adding at least a number of three additional parameters to the set of parameters P(n). The parameters of control of the scan program can comprise parameters of a scan rotation, a pixel number of a scan line and the number of scanning lines and add another three parameters to the list of parameters P(n). As a consequence, number N of parameters P(n) is typically in a range between N=15 and N=25, but the number N may even exceed N=30.

Next it is explained how the previously determined driving parameters P(C,n) are obtained. The set of previously determined driving parameters P(C,n) is also referred to as the set of calibration parameters P(C,n). At least a reference sample is placed on the substrate table 500 and a set of calibration parameters P(C,n, zi) is achieved by calibration of the system at a series of z-position of a set of working distances within the desired range for adjustment of the WD. The series of z-positions can comprise three z-positions, five z-positions or even more z-positions. Thereby, either a reference system is used with a z-stage, or a reference wafer with different heights in the WD range is provided. It is also possible to configure the wafer stage with a set of calibration sample locations at different z-positions within the WD range to repeat the calibration in situ. Thereby, the parameter settings for a limited set of WDs can be repeatedly acquired by calibration routines, which are performed on a routine basis, for example daily or every wafer batch. Thereby, effects of a slow drifts or an aging of the multi-beam charge particle system are compensated. For the determination of calibration parameter settings P(C,n,zi) and a description of calibration samples, it is referred to U.S. Pat. No. 9,991,089 B2, which is incorporated hereby by reference.

Figures 5A, 5B:
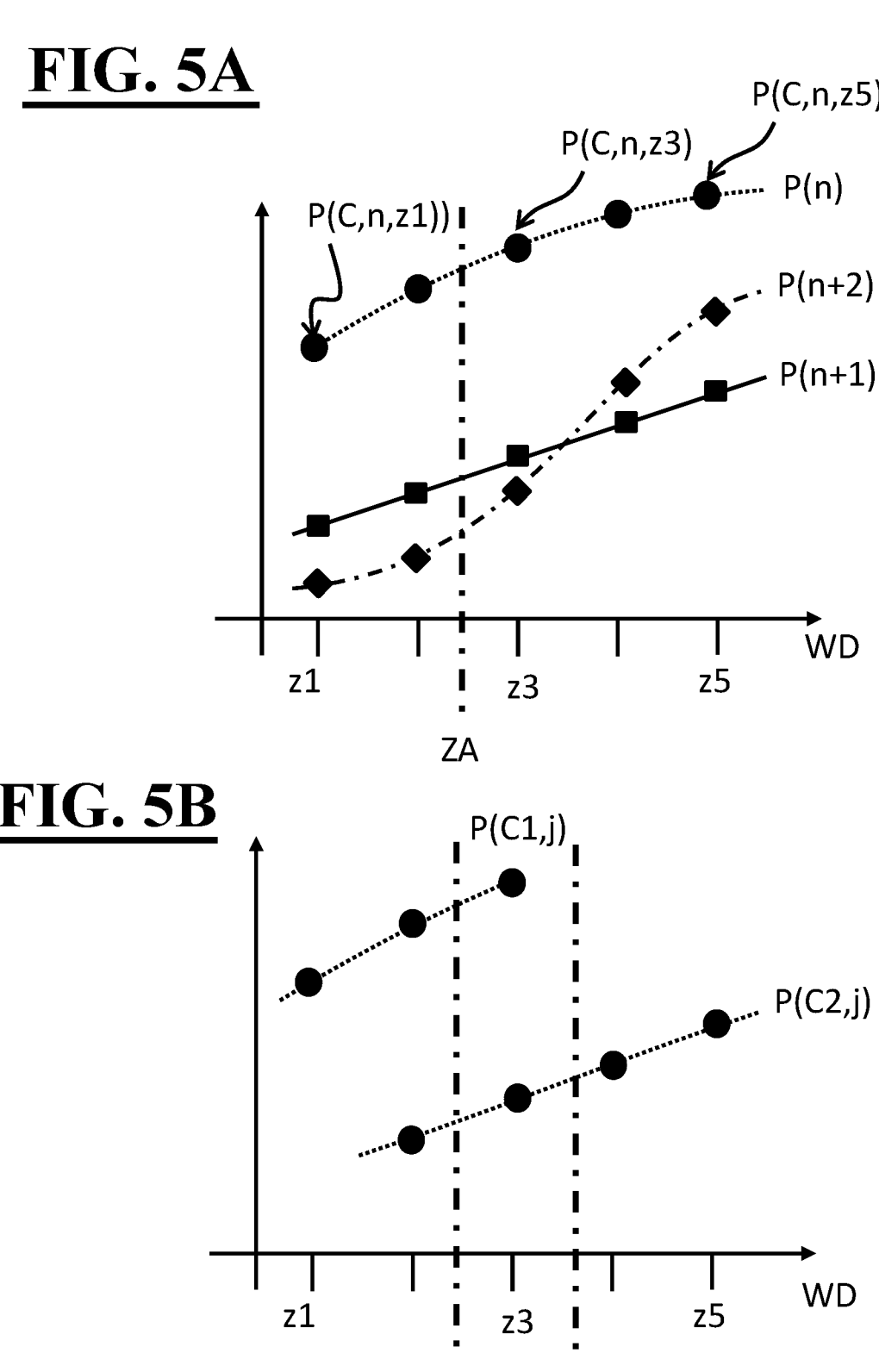
FIGS. 5A-5B illustrate an example of a plurality of calibration settings and the interpolation of parameter settings.

FIG. 5A illustrates a simplified example of a result of a set of 5 calibration parameter setting measurements P(C,n,zi) with n=1 . . . N at a set of five WDs with z-distance z1 to z5, including for example P(C,n,z1) to P(C,n,Z5) for the nth parameter. Only the three parameters n, n+1 and n+2 of the generally N parameters are illustrated. In the first example, for a given working distance WD=ZA determined according step 2, the driving parameters P(n) at position z=ZA can thus be obtained from an interpolation from the set of calibration parameters P(C,n,zi) by an appropriate interpolation model, for example a linear, a cubic or a spline interpolation model. The vertical axis illustrates the parameter values in arbitrary units. The desired changes of parameters can be in the range of +/−5% to +/−20% of each driving parameter.

For each of the set of working distances Zi, ideal driving parameters P(C,n) are achieved. However, since the multi-beam charged particle system is overdetermined, there might be several ideal solutions of parameter settings at a given position, for example position z3, with different impact to unwanted effects, for example a change of resolution or an change in postprocessing operations of step S5. In the second example, several different parameters settings are determined at least at one z-position (here z2 or z3) during the calibration step and the impact on image performance is recorded in the inspection setting. It can be desirable to switch from a first setting C1 with P(C1,j) at a WD=ZA1 to a second setting C2 with P(C2,j) at a WD=ZA2. Such an example is illustrated in FIG. 5B. FIG. 5B illustrates the effect of setting change at a single parameter P(j), but of course, typically a large number of parameters has to be changed between a first setting C1 to a second setting C2. The number of possible parameter settings to achieve a certain working distance ZA1 might even be larger than two. The selection of the setting parameters P(n) with n=1 to N at a specific working distance ZA is performed depending on the desired properties for the inspection task at the inspection site. For a metrology operation, during or after which a dimension such as a CD (critical dimension) is determined at an inspection site at a working distance ZA1, a parameter setting is selected with minimum impact on resolution and image distortion, for example parameter setting C2. In another example, for a comparison of complex features on the surface of the wafer, or when an image stitching is used, parameters settings offering low rotation and high image fidelity might be desirable. For such inspection tasks, for example parameter setting C1 with a different impact on the image performance is selected.

Therefore, and despite the many parameters which are changed during an adjustment of the working distance WD, an imaging performance of an inspection task at an inspection site of wafer might been changed. In an example, the impact on an imaging performance, such as a resolution, an image rotation, an image fidelity, an image acquisition time is determined during the calibration. An inspection task typically comprises specific threshold properties for the imaging performance. During the selection of an inspection setting, the impacts on an imaging performance introduced by the change of the parameters to change the working distance WD according for example a first and a second inspection setting are compared to the threshold desired properties of an inspection task, and for example the first inspection setting with an imaging performance within the desired threshold is selected and a second inspection setting exceeding the desired threshold of the inspection task is discarded. Examples of thresholds can be a maximum value for a desired resolution of for example below 5 nm, 4 nm, 3 nm or even less, a maximum value of a distortion of for example below 1 nm, 0.5 or even less, or a maximum angle between a first scanning direction and an axis defined by the horizontal or vertical structures (HV-structures) of the semiconductor features on the wafer of below 50 mrad, 30 mrad, 10 mrad or even less. Another threshold value can for example be the maximum deviation from a telecentric illumination, meaning the maximum angle deviation of a center axis of each beamlet with the wafer normal of below 30 mrad, such as below 10 mrad. In an alternative example, the image acquisition time might be of more relevance and a threshold for an image acquisition time is defined for a specific wafer inspection task. In such case, a fast image acquisition is often desired over a precise image acquisition. The desired threshold properties are typically provided with the list of wafer inspection tasks.

The inspection setting comprising information about the expected imaging performances is recorded together with the inspection result and can optionally be considered in the image processing step S5. Examples are a change in a pixel number per scanning line for each primary beamlet, a change in a rotation angle of the raster configuration 103, or a change of a focus diameter of the focus points 5 of the primary beamlets 3. The selection of the inspection setting at an inspection site can be performed based on an inspection task or based on a preselected inspection setting.

Figure 7:
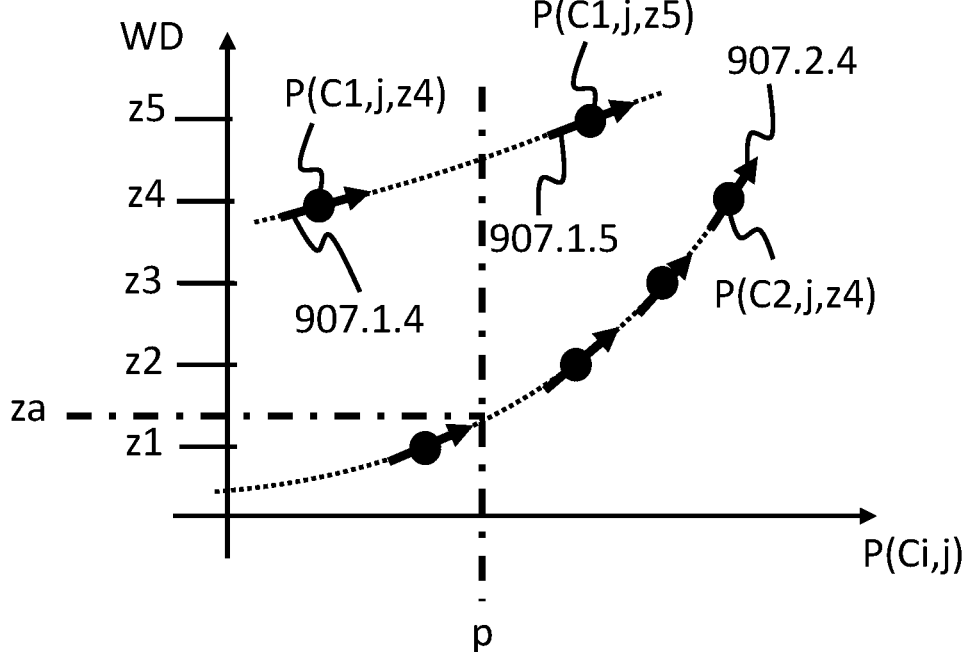
FIG. 7 illustrates an example of a parameter being a lens current of a magnetic lens including a determination of the sensitivity of the parameter.

A further example of parameter interpolation according step 2 is illustrated in FIG. 7. FIG. 7 illustrates the change of WD over a parameter P(j) of a set of N parameters. As in FIG. 5B, two sets of parameters C1 and C2 with two different changes of the WD in dependence of the parameter j together with the other parameters of the set of parameters are indicated. The set C1 of parameters P(C1,1 . . . N) including P(C1 j) is used for larger WD values and the second set C2 of parameters P(C2,1 . . . N) including P(C2 j) is used for smaller values of WD. The parameter P(Ci,j) is for example a current of a magnetic objective lens. With increasing WD from z1 to z4, the parameter of the lens current of the magnetic lens is increased. At a WD of z=z4, the rotation of the raster configuration introduced by the magnetic objective lens becomes too large and a WD change is for example introduced by a combination of several parameters of other components, such as the micro-optical elements of the multi-beamlet forming unit 305 in combination with condenser lenses 307, 308 and 99. For even larger WD, the parameter value of the current is again increased. In order to better interpolate the actual parameters p at an actual WD=za, not only the set of parameters at a set of predefined WD-values is determined in the calibration step, but also the local sensitivity of a WD change induced by the parameter values. This slope value 907 is for example determined by performing slight variations to the set of parameters at each set of predetermined WDs, for example WD=z4. At this WD=z4, two sets of parameters, the first set C1 and the second set C2 are determined. A first parameter P(C1,j,z4) is determined together with the first slope value illustrated by arrow 907.1.4, and a second parameter P(C2, j,z4) is determined together with the second slope value illustrated by arrow 907.2.4. In an example of the disclosure, the selection of sets of parameters to set up a desired WD is selected according the local slope of the WD-changes over the parameters. For example, for a robust imaging condition, a small slope or sensitivity is often desirable. In this example, for WD>z4, the first set of parameters is selected with the smaller slope value 907.1.4. In another example, if for example a slope angle of a wafer is detected and a WD is frequently changed according an inspection position on a wafer, a large slope value or sensitivity can be desirable, which can allow a fast change of WD with a small parameter variation. In such an example, the second parameter set C2 is selected. Generally, the sensitivity of a change of the working distance WD with respect to a change of a least one of the parameters the N parameter values can be determined from the predetermined calibration parameter values P(C1,1

. . . N) or P(C2,1 . . . N), for example by interpolation. Therefore, according a method of the disclosure, a selection of an inspection setting can be performed according a sensitivity of a change of the working distance WD with respect to a change of a least one of the parameters of the N parameter values of the inspection setting. In an example, the inspection setting is selected in accordance with a desired robustness of the second wafer inspection task by selection of the inspection setting with a minimal sensitivity of a change of the working distance with respect to a change of at least one of the parameters of the N parameter values. In an alternative example, the inspection setting is selected in accordance with a desired speed of the second wafer inspection task by selection of the inspection setting with a maximal sensitivity of a change of the working distance with respect to a change of at least one of the parameters of the N parameter values.

Generally, by determining the local gradient or sensitivity of a WD-change with respect to a change of a set of parameters during the calibration step, also an interpolation of parameter values is improved. For example, a spline interpolation or interpolation methods utilizing local gradients such as Runge-Kutta methods can be applied.

According the method described above, when a new wafer is loaded to the multi beam charged particle system 1, and the actual WD at an inspection site is determined via the z-sensor 107 or via a priori knowledge about the wafer 7. The actual WD is adjusted by changing the plurality of N parameters P(n) based on a selection and interpolation from the previously determined calibration parameters, which are stored in a database.

Thereby, the WD is changed about +/−10 μm, but also large ranges of about +/−100 μm are possible, or for example changes of about +/−300 μm. The latter becomes possible especially when the selection of different calibration settings or a change of calibration settings as for example a change from calibration settings C1 or C2, as illustrated in FIG. 4b, is considered. With the method according the disclosure, a fast change of the WD is enabled with an accuracy of about better than 100 nm, such as of even 50 nm or even below. Especially, no time consuming and iterative autofocus routines are required.

The WD control is based on computing (e.g. by interpolation) the parameter settings based on the z-information of the sample surface 25 and at least a set of previously determined calibration parameters P(C,n) at a set of z-distances. The WD control includes a change of a plurality of N>=15 parameters and ensures that the imaging performance specifications are met, as for example changes to beam pitch, raster rotation and telecentricity in the primary and secondary beam path of the multi-beam charged particle system are compensated or considered during an image acquisition.

The multi-beam charged particle system 1 of FIG. 2 according the disclosure comprises a control unit 800 for controlling the operation of a plurality of adjustable components. The control unit is configured to provide a set of operating parameters including the N>=parameters P(n) to components of the multi-beam charged particle system 1. The components include components of the primary beam path 13, which are connected to a control unit 830 of the primary beam path, and include components of the secondary beam path 11, which are connected to the control unit 820 of the secondary beam path. Control unit 800 further comprises a scanning control operator, which is connected to the collective raster scanner 110 in the primary and secondary beam path and to the collective raster scanner 222 in the secondary beam-path. The control unit is configured to perform an adjustment of the method for fast changing the working distance WD of the multi-beam charged particle system 1 and to drive in addition a plurality of compensators according the set of N parameters P(n). The control unit 800 further comprises a memory, in which a plurality of calibration parameter sets is stored during use. The control unit 800 further comprises a processor with software code installed, configured for during use computing and selecting the parameter setting P(n) according the method described above.

The disclosure is further described by following clauses:

Clause 1: A method of setting a working distance WD of a multi-beam charged particle system (1) with a raster (41) of a plurality of primary charged particle beamlets (3) for wafer inspection, the working distance WD being defined as a distance parallel to an optical axis (105) between a reference plane (109) of the multi-beam charged particle system (1) and a wafer surface (25) of a wafer (7), the method comprising the steps of:

determining a first working distance WD1 of the multi-beam charged particle system (1) at a first inspection site (33, 35) of a first wafer inspection task, determining a change dWD of the first working distance WD1 to achieve a second working distance WD2 of a second inspection site (33, 35) of a second, subsequent wafer inspection task, computing N parameter values P(1 . . . N) of a set of N parameters of components being capable to jointly change the first working distance WD1 to the second working distance WD2 while maintaining an imaging specification of a wafer inspection task, providing the computed N parameter values P(1 . . . N) to the components of the multi-beam charged particle system (1), performing the second wafer inspection task at the second inspection site with an inspection setting with the computed parameter values P(1 . . . N) and a corresponding image performance within the imaging specification of the second wafer inspection task, wherein the computation of N parameter values P(1 . . . N) of the set of N parameters is performed by interpolation from a first set of predetermined calibration parameter values P(C1, 1 . . . N) of the set of N parameters.

Clause 2: A method according to clause 1, wherein the set of N parameters comprises a parameter to adjust or change a scan program configured to operate a scanning deflector (110) of the multi-beam charged particle system (1), wherein the change of the scan program comprise a scan rotation to compensate a rotation of the raster (41) of the plurality of primary beamlets (3) and/or a change of a scanning pixel number in a scanning line to compensate a change of a pitch between the plurality of primary beamlets (3).

Clause 3: A method according to clause 2, wherein the set of N parameters further comprises at least a parameter to control one of the following components of the multi-beam charged particle system (1): an array of micro-lenses (306.1), an array element acting as deflector array (306.3) to adjust a pitch of a plurality of beamlets (3), first field lenses (307, 308), second field lenses (99), an objective lens (102), a beam splitter (400), a voltage supply (503) for an electrode to generate a retarding field, or a telecentricity compensator array (390).

Clause 4: A method according to any of the clauses 1 to 3, further comprising the step of loading a wafer (7) to a wafer table (500) with a fixed position in the z-direction parallel to the optical axis (105) of the multi-beam charged particle system (1) and positioning a wafer (7) at the first inspection site (33,35) beyond the reference plane (109) of the objective lens (102) of the multi-beam charged particle system (1), and wherein the step of determining the first working distance WD1 comprises measuring the first working distance WD1 between a wafer surface (25) and the reference plane (109) with a distance sensor (107).

Clause 5: A method according to any of the clauses 1 to 4, further comprising the step of moving the wafer (7) with a wafer table (500) with a fixed position in the z-direction parallel to the optical axis (105) of the multi-beam charged particle system (1) to the second inspection site (33,35), and wherein the step of determining the change dWD to achieve the second working distance WD2 comprises measuring the second working distance WD2 between a wafer surface (25) and the reference plane (109) with a distance sensor (107).

Clause 6: A method according to any of the clauses 1 to 5, wherein the step of computing the N parameter values P(1 . . . N) comprises a step of selecting the inspection setting from a first inspection setting with the first set of calibration parameters values P(C1,1 . . . N) and a second inspection setting with a second set of calibration parameters values P(C2,1 . . . N).

Clause 7: A method according to clause 6, wherein the selection of the inspection setting is performed according a sensitivity of a change of the working distance with respect to a change of a least one of the parameters the N parameter values according the first or second set of calibration parameters values P(C1,1 . . . N) or P(C2,1 . . . N).

Clause 8: A method according to clause 7, wherein the inspection setting is selected in accordance with a desired robustness of the second wafer inspection task by selection of the second inspection setting with a minimal sensitivity of a change of the working distance with respect to a change of at least one of the parameters of the N parameter values.

Clause 9: A method according to clause 7, wherein the inspection setting is selected in accordance with a desired speed of the second wafer inspection task by selection of the inspection setting with a maximal sensitivity of a change of the working distance with respect to a change of at least one of the parameters of the N parameter values.

Clause 10: A method according to clause 6, wherein the selection of the inspection setting is performed according to a desired threshold of an imaging performance of the second wafer inspection task.

Clause 11: A method according to any of the clauses 6 to 10, wherein the first set of predetermined calibration parameter values P(C1, 1 . . . N) comprise predetermined calibration parameter values P(C1, 1 . . . N) at at least three calibration working distances, and the N parameter values P(1 . . . N) according the second working distance WD2 are interpolated from the predetermined calibration parameter values P(C1, 1 . . . N) at the at least three calibration working distances.

Clause 12: A method according to clause 11, further comprising a calibration step of determining the first set of predetermined calibration parameter values P(C1, 1 . . . N) at at least three calibration working distances z1, z2 and z3 and storing the predetermined calibration parameter values P(C1, 1 . . . N) in a memory of the multi-beam charged particle system (1).

Clause 13: A method according to any of the clauses 1 to 12, further comprising the steps of
    storing the inspection setting with an inspection result of the second inspection task in a memory, performing a post-processing of the inspection result and considering the stored inspection setting during the postprocessing.

Clause 14: A multi-beam charged particle system (1) for wafer inspection, comprising
    i. an object irradiation unit (100) for focusing a plurality of primary charged particle beamlets (3) on a surface (25) of a wafer (7),
    ii. a wafer table (500) configured for holding a wafer (7) with a fixed position in the z-direction parallel to the optical axis (105) of the multi-beam charged particle system (1), and configured for laterally moving a wafer (7),
    iii. a plurality of components for jointly changing a working distance between a wafer surface (25) and a reference surface (109) of the object irradiation unit (100) while maintaining an imaging specification of a wafer inspection task,
    iv. a detection unit (200) comprising a charged particle detector (207),
    v. a control unit (800) configured for determining a first working distance WD1 at an inspection site on a wafer surface (25), the control operator (800) being connected to the plurality of components for jointly changing a working distance,
wherein the control unit (800) is configured to determine parameter values P(1 . . . N) and provide the parameter values P(1 . . . N) to the plurality of components for jointly changing a working distance to the first working distance WD1 while maintaining the imaging specification of a wafer inspection task.

Clause 15: A multi-beam charged particle system (1) according to clause 14, wherein the control unit (800) comprises a memory for storing at least a first set of predetermined calibration parameter values P(C1, 1 . . . N), and wherein the control unit (800) is configured to compute the parameter values P(1 . . . N) from the first set of predetermined calibration parameter values P(C1, 1 . . . N) by interpolation.

Clause 16: A multi-beam charged particle system (1) according to clause 14 or 15, wherein a first component of the plurality of components is a scanning deflector (110), and wherein the control unit (800) is configured to determine and provide a scanning program to the scanning deflector (110) to maintain the imaging specification of a wafer inspection task.

Clause 17: A multi-beam charged particle system (1) according to any of the clauses 14 to 16, wherein the plurality of components comprises at least one of an array of micro-lenses (306.1), an array element acting as deflector array (306.3) to adjust a pitch of a plurality of beamlets (3), first field lenses (307, 308), second field lenses (99), an objective lens (102), a beam splitter (400), a voltage supply (503) for an electrode to generate a retarding field, or a telecentricity compensator array (390).

Clause 18: A multi-beam charged particle system (1) according to any of the clauses 14 to 17, further comprising a distance sensor (107) connected to the control unit (800), arranged and configured to measure during use the working distance between the reference surface (109) and a wafer surface (25).

Clause 19: A multi-beam charged particle system (1) according to any of the clauses 14, wherein the control unit (800) is configured to perform any of the methods of claim 1 to 13.

The disclosure is however not limited to the clauses. As will be clear from the description, combinations and various modifications to the examples and embodiments are possible and can be applied in analogy to the embodiments or examples. Charged particles of the primary beam can for example be electrons, but also other charged particles such as He-Ions. Secondary electrons comprise secondary electrons in its narrow sense, but also any other secondary charged particle created by interaction of the primary charged particle beamlets with the sample, such as backscattered electrons or secondary electrons of second order, which are generated by backscattered electrons. In another example, secondary ions can be collected instead of secondary electrons.

A list of reference numbers is provided:

1 multi-beamlet charged-particle microscopy system
3 primary charged particle beamlets, forming the plurality of primary charged particle beamlets
5 primary charged particle beam spot
7 object
9 secondary electron beamlet, forming the plurality of secondary electron beamlets
11 secondary electron beam path
13 primary beam path
15 secondary charged particle image spot
17 image patch
19 overlap area of image patches
21 image patch center position
25 Wafer surface
27 scan path of primary beamlet
29 center of image subfield
31 image subfield
33 first inspection site
34 second inspection site
35 third inspection site
39 overlap areas of subfields 31
41 raster configuration
99 field lenses
100 object irradiation unit
101 object plane
102 objective lens
103 raster in object plane
105 optical axis of multi-beamlet charged-particle microscopy system
107 Z-Distance sensor
109 reference plane of objective lens
110 first multi-beam scanning deflection system
200 detection unit
205 projection system
206 electrostatic lens
207 image sensor
208 imaging lens
210 imaging lens
211 image or detection plane
212 second cross over
214 aperture filter
215 pixel areas for one secondary beamlet
217 second raster
220 multi-aperture corrector
222 second deflection system
300 charged-particle multi-beamlet generator
301 charged particle source
303 collimating lenses
305 primary multi-beamlet-forming unit
306 active multi-aperture plates
307 first field lens
308 second field lens
309 electron beam
311 collimated electron beam 313 multi aperture surface plane
315 plurality of apertures
317 primary electron beamlet spots
319 raster of apertures or spots
323 primary electron beamlet spots
325 intermediate image surface
390 beam steering multi aperture plate
400 beam splitter unit
403 adjustment lens
420 magnetic element
500 sample stage
503 Sample voltage supply
507 wafer holding plane
800 control unit
820 projection system control module
830 primary beam-path control module
907 Arrow indicating the slope

What is claimed is:

1. A method of setting a working distance of a multi-beam charged particle system with a raster of a plurality of primary charged particle beamlets to inspect a wafer, the working distance being defined as a distance parallel to an optical axis between a reference plane of the multi-beam charged particle system and a wafer surface of the wafer, the method comprising:

determining a first working distance of the multi-beam charged particle system at a first inspection site of a first wafer inspection task;

determining a change of the first working distance to achieve a second working distance of a second inspection site of a second wafer inspection task subsequent to the first wafer inspection task;

computing N parameter values of a set of N parameters of components of the multi-beam charged particle system capable of jointly changing the first working distance to the second working distance while maintaining an imaging specification of a wafer inspection task, computing the N parameter values of the set of N parameters comprising interpolating a first set of predetermined calibration parameter values of the set of N parameters;

providing the computed N parameter values to the components of the multi-beam charged particle system; and performing the second wafer inspection task at the second inspection site using an inspection setting with the computed parameter values and a corresponding image performance within an imaging specification of the second wafer inspection task.

2. The method of claim 1, wherein:

the set of N parameters comprises a parameter to adjust or change a scan program configured to operate a scanning deflector of the multi-beam charged particle system;

the change of the scan program comprises a scan rotation to compensate a rotation of the raster of the plurality of primary beamlets and/or a change of a scanning pixel number in a scanning line to compensate a change of a pitch between the plurality of primary beamlets.

3. The method of claim 2, wherein:

the set of N parameters further comprises a parameter to control a component of the multi-beam charged particle system; and the component of the multi-beam charged particle system comprises a member selected from the group consisting of an array of micro-lenses, an array element acting as deflector array to adjust a pitch of a plurality of beamlets, field lenses, an objective lens, a beam splitter, a voltage supply for an electrode to generate a retarding field, and a telecentricity compensator array.

4. The method of claim 1, further comprising:

loading the wafer to a wafer table with a fixed position in a direction parallel to the optical axis of the multi-beam charged particle system; and positioning the wafer at the first inspection site beyond a reference plane of an objective lens of the multi-beam charged particle system, wherein determining the first working distance comprises using a distance sensor to measure the distance between the wafer surface and the reference plane.

5. The method of claim 1, further comprising using a wafer table with a fixed position in a direction parallel to the optical axis of the multi-beam charged particle system to move the wafer to the second inspection site, wherein determining the change of the first working distance to achieve the second working distance comprises using a distance sensor to measure the second working distance between the wafer surface and the reference plane.

6. The method of claim 1, wherein the step of computing the N parameter values comprises selecting the inspection setting from a first inspection setting with the first set of predetermined calibration parameters values and a second inspection setting with a second set of predetermined calibration parameters values.

7. The method of claim 6, wherein selecting the inspection setting is performed according to a sensitivity of a change of the working distance with respect to a change of at least one of the parameters the N parameter values according the first predetermined calibration parameter values or the second set of predetermined calibration parameters values.

8. The method of claim 7, wherein the inspection setting is selected in accordance with a desired robustness of the second wafer inspection task by selecting the second inspection setting with a minimal sensitivity of a change of the working distance with respect to a change of at least one of the parameters of the N parameter values.

9. The method of claim 7, wherein the inspection setting is selected in accordance with a desired speed of the second wafer inspection task by selecting the inspection setting with a maximal sensitivity of a change of the working distance with respect to a change of at least one of the parameters of the N parameter values.

10. The method of claim 6, wherein selecting the inspection setting is performed according a threshold of an imaging performance of the second wafer inspection task.

11. The method of claim 6, wherein the first set of predetermined calibration parameter values comprise predetermined calibration parameter values at at least three calibration working distances, and the N parameter values according the second working distance are interpolated from the predetermined calibration parameter values at the at least three calibration working distances.

12. The method of claim 11, further comprising determining the first set of predetermined calibration parameter values at at least three calibration working distances, and storing the predetermined calibration parameter values in a memory of the multi-beam charged particle system.

13. The method of claim 1, further comprising:

storing the inspection setting with an inspection result of the second inspection task in a memory; and performing a post-processing of the inspection result, wherein the stored inspection setting is considered during the postprocessing.

14. One or more machine-readable hardware storage devices comprising instructions that are executable by one or more processing devices to perform operations comprising the method of claim 1.

15. A system, comprising:

one or more processing devices; and one or more machine-readable hardware storage devices comprising instructions that are executable by the one or more processing devices to perform operations comprising the method of claim 1.

16. A multi-beam charged particle system, comprising:

an object irradiation unit configured to focus a plurality of primary charged particle beamlets on a surface of a wafer, a wafer table configured to hold the wafer with a fixed position in a direction parallel to an optical axis of the multi-beam charged particle system, the wafer table configured to laterally move the wafer;

a plurality of components configured to jointly change a working distance between the wafer surface and a reference surface of the object irradiation unit while maintaining an imaging specification of a wafer inspection task;

a detection unit comprising a charged particle detector;

a control unit configured to determine a first working distance at an inspection site on the wafer surface, wherein:

the control unit is configured to control the plurality of components to control jointly changing the working distance;

the control unit is configured to: i) determine parameter values; and ii) provide the parameter values to the plurality of components to jointly change a working distance to the first working distance while maintaining the imaging specification of a wafer inspection task.

17. The multi-beam charged particle system of claim 16, wherein the control unit comprises a memory to store a first set of predetermined calibration parameter values, and the control unit is configured to compute the parameter values from the first set of predetermined calibration parameter values by interpolation.

18. The multi-beam charged particle system of claim 16, wherein a first component of the plurality of components comprises a scanning deflector, and the control unit is configured to determine and provide a scanning program to the scanning deflector to maintain the imaging specification of a wafer inspection task.

19. The multi-beam charged particle system of claim 16, wherein the plurality of components comprises at least one member selected from the group consisting of an array of micro-lenses, an array element configured to act as deflector array to adjust a pitch of a plurality of beamlets, field lenses, an objective lens, a beam splitter, a voltage supply for an electrode to generate a retarding field, and a telecentricity compensator array.

20. The multi-beam charged particle system of claim 16, further comprising a distance sensor connected to the control unit, wherein the sensor is configured to measure the working distance between the reference surface and the wafer surface.

* * * * *